US012465091B2

(12) United States Patent
Courbat

(10) Patent No.: US 12,465,091 B2
(45) Date of Patent: Nov. 11, 2025

(54) AEROSOL-GENERATING SYSTEM WITH RESONANT CIRCUIT FOR CARTRIDGE RECOGNITION

(71) Applicant: Philip Morris Products S.A., Neuchatel (CH)

(72) Inventor: Jerome Christian Courbat, Cortaillod (CH)

(73) Assignee: Philip Morris Products S.A., Neuchatel (CH)

( * ) Notice: Subject to any disclaimer, the term of this patent is extended or adjusted under 35 U.S.C. 154(b) by 466 days.

(21) Appl. No.: 17/906,675

(22) PCT Filed: Mar. 18, 2021

(86) PCT No.: PCT/EP2021/057006
§ 371 (c)(1),
(2) Date: Sep. 19, 2022

(87) PCT Pub. No.: WO2021/191053
PCT Pub. Date: Sep. 30, 2021

(65) Prior Publication Data

US 2023/0134500 A1 May 4, 2023

(30) Foreign Application Priority Data

Mar. 23, 2020 (EP) .................................... 20165038

(51) Int. Cl.
*A24F 40/40* (2020.01)
*A24F 40/00* (2020.01)
(Continued)

(52) U.S. Cl.
CPC .............. *A24F 40/53* (2020.01); *A24F 40/42* (2020.01); *A24F 40/46* (2020.01); *A24F 40/51* (2020.01); *H05B 3/0014* (2013.01); *H03H 7/00* (2013.01)

(58) Field of Classification Search
CPC .......... A24F 40/10; A24F 40/42; A24F 40/46; A24F 40/51; A24F 40/53; H03H 7/00; H05B 3/0014
See application file for complete search history.

(56) References Cited

U.S. PATENT DOCUMENTS 12,004,566 B2 * 6/2024 Korus .................. A24F 40/465
2014/0203890 A1 * 7/2014 Taniguchi ........... H03H 7/1791
333/175

(Continued)

FOREIGN PATENT DOCUMENTS

CN 110876489 A 3/2020
DE 600 16 946 T2 6/2006

(Continued)

OTHER PUBLICATIONS

Combined Russian Notice of Allowance and Search Report issued Jul. 18, 2024 in Russian Patent Application No. 2022127406/03 (with English Translation of Category of Cited Documents), citing references 15-18 therein, 12 pages.

(Continued)

*Primary Examiner* — Abdullah A Riyami
*Assistant Examiner* — Thang H Nguyen
(74) *Attorney, Agent, or Firm* — Oblon, McClelland, Maier & Neustadt, L.L.P.

(57) ABSTRACT

An aerosol-generating system is provided, including: a cartridge including an aerosol-forming substrate; a resonant circuit, the cartridge including at least part of the resonant circuit, the circuit being configured to resonate at a predetermined resonant frequency associated with an identity of the cartridge; and an aerosol-generating device including: a housing to removably receive the cartridge, a power source to supply power to the cartridge, and control circuitry including a controller configured to determine a resonant frequency of the resonant circuit when the cartridge is (Continued)

received by the device, and identify the cartridge based on the determined frequency, the cartridge having a connection end to connect the cartridge to the device and including electrical contacts to electrically connect the cartridge to the device, and the device having a connection end to connect the device to the cartridge and including electrical contacts configured to electrically connect the device to the cartridge.

17 Claims, 7 Drawing Sheets

(51) Int. Cl.

| | |
|---|---|
| ***A24F 40/42*** | (2020.01) |
| ***A24F 40/46*** | (2020.01) |
| ***A24F 40/51*** | (2020.01) |
| ***A24F 40/53*** | (2020.01) |
| ***H05B 3/00*** | (2006.01) |
| *H03H 7/00* | (2006.01) |

(56) References Cited

U.S. PATENT DOCUMENTS

| | | | | |
|---|---|---|---|---|
| 2017/0202266 | A1 | 7/2017 | Sur | |
| 2019/0053538 | A1* | 2/2019 | Batista | G06K 19/0723 |
| 2020/0036080 | A1* | 1/2020 | Ourednik | H04B 5/77 |
| 2020/0128880 | A1* | 4/2020 | Gage | A24D 1/14 |
| 2021/0145067 | A1 | 5/2021 | Bleloch et al. | |
| 2021/0186108 | A1* | 6/2021 | Korus | A24F 40/465 |
| 2021/0186109 | A1* | 6/2021 | Milligan | A24F 40/57 |
| 2021/0204612 | A1* | 7/2021 | Korus | A24F 40/57 |
| 2021/0267280 | A1* | 9/2021 | Zigmund | A24F 40/60 |
| 2022/0039465 | A1* | 2/2022 | Du | A24F 40/30 |
| 2022/0160045 | A1* | 5/2022 | Horrod | H05B 6/06 |

FOREIGN PATENT DOCUMENTS

| | | | | |
|---|---|---|---|---|
| EP | 3 307 101 | A1 | 4/2018 | |
| EP | 3 599 574 | A1 | 1/2020 | |
| JP | 7505722 | B2 | 6/2024 | |
| KZ | 33794 | B | 7/2019 | |
| RU | 2 670 534 | C1 | 10/2018 | |
| WO | WO 2011/160788 | A1 | 12/2011 | |
| WO | WO 2017/084848 | A1 | 5/2017 | |
| WO | WO 2018/195335 | A1 | 10/2018 | |
| WO | WO-2020020970 | A1 * | 1/2020 | H05B 6/08 |
| WO | WO-2020043901 | A1 * | 3/2020 | H05B 6/108 |

OTHER PUBLICATIONS

International Search Report mailed on Jun. 30, 2021 in PCT/EP2021/057006 filed on Mar. 18, 2021 (citing references 1-4 & 15-19 therein, 4 pages).
Written Opinion mailed on Jun. 30, 2021 in PCT/EP2021/057006 filed on Mar. 18, 2021 (citing references 2 & 15-19 therein, 7 pages).
International Preliminary Report on Patentability mailed on Mar. 29, 2022 in PCT/EP2021/057006 filed on Mar. 18, 2021 (citing references 2 & 15-19 therein, 8 pages).
Extended European Search Report issued Oct. 6, 2020, in corresponding European Patent Application No. 20165038.9. 8 pages.
Ian C. Purdie, "LC Meter Project and Kit—L/C Meter IIB", Apr. 12, 2000, 11 pages https://pe2bz.philpem.me.uk/Comm01/-%20TestEquip/-%20Tester-NonActiveDevice/CI-251-IndCap-MeterKit/lc-meter-project.htm.
Serge Y. Stroobandt, "RF Inductance Calculator for Single-Layer Helical Round-Wire Coils", 2020, 11 pages https://hamwaves.com/inductance/en/index.html.
Electrical Engineering, "How is this oscillator circuit supposed to work?", 2020, 5 pages https://electronics.stackexchange.com/questions/282451/how-is-this-oscillator-circuit-supposed-to-work.
Combined Chinese Office Action and Search Report issued Mar. 29, 2025, in corresponding Chinese Patent Application No. 202180021428.2 (with English Translation) citing documents 1 and 15 therein, 19 pages.

* cited by examiner

AEROSOL-GENERATING SYSTEM WITH RESONANT CIRCUIT FOR CARTRIDGE RECOGNITION

CROSS-REFERENCE TO RELATED APPLICATIONS

This application is a U.S. national stage application of PCT/EP2021/057006, filed on Mar. 18, 2021, which is based upon and claims the benefit of priority under 35 U.S.C. § 119 from European patent application no. 20165038.9, filed Mar. 23, 2020, the entire contents of each of which are incorporated herein by reference.

TECHNICAL FIELD

The present disclosure relates to an aerosol-generating system comprising a cartridge. In particular, the present disclosure relates to an aerosol-generating system comprising a resonant circuit which can be used to identify the cartridge or its contents. The present disclosure also relates to a cartridge for use with an aerosol-generating device, and an aerosol-generating device for use with the cartridge.

DESCRIPTION OF THE RELATED ART

Handheld electrically operated aerosol-generating systems can have a modular construction comprising a device and a removable cartridge. In known aerosol-generating systems the device typically comprises a battery and control electronics and the cartridge comprises a liquid storage portion holding a supply of liquid aerosol-forming substrate and an electric heater. The heater typically comprises a coil of wire which is wound around an elongate wick which transfers liquid aerosol-forming substrate from the liquid storage portion to the heater. An electric current can be passed through the coil of wire to heat the heater and thereby generate an aerosol from the aerosol-forming substrate. The cartridge generally also comprises a mouthpiece through which a user may draw aerosol into their mouth.

Cartridges are typically interchangeable and can comprises a range of different aerosol-forming substrates which may vary considerably in composition, flavour, strength or other characteristics. A user is able to interchange cartridges at will. However, the conditions required to aerosolise a certain aerosol-forming substrate or produce a certain user experience may vary from cartridge to cartridge. In particular, the heating profile required for a particular cartridge may depend on the characteristics of the aerosol-forming substrate.

It would therefore be desirable to provide a means of automatically identifying a cartridge so that an aerosol-generating device can generate an optimal aerosol from a plurality of cartridges containing different aerosol-forming substrates.

SUMMARY

According to an example of the present disclosure, there is provided an aerosol-generating system. The aerosol-generating system may comprise a cartridge including an aerosol-forming substrate. The aerosol-generating system may also comprise a resonant circuit, wherein the cartridge comprises at least a portion of the resonant circuit, and the resonant circuit is configured to resonate at a predetermined resonant frequency, and wherein the predetermined resonant frequency is associated with an identity of the cartridge. The aerosol-generating system may further comprise: an aerosol-generating device including: a housing configured to removably receive the cartridge; a power source for supplying power to the cartridge; and control circuitry. The control circuitry may comprise a controller configured to: determine the resonant frequency of the resonant circuit when the cartridge is received by the aerosol-generating device; and identify the cartridge based on the determined resonant frequency.

BRIEF DESCRIPTION OF THE DRAWINGS

Examples will now be further described with reference to the figures in which.

DETAILED DESCRIPTION

Figure 1:
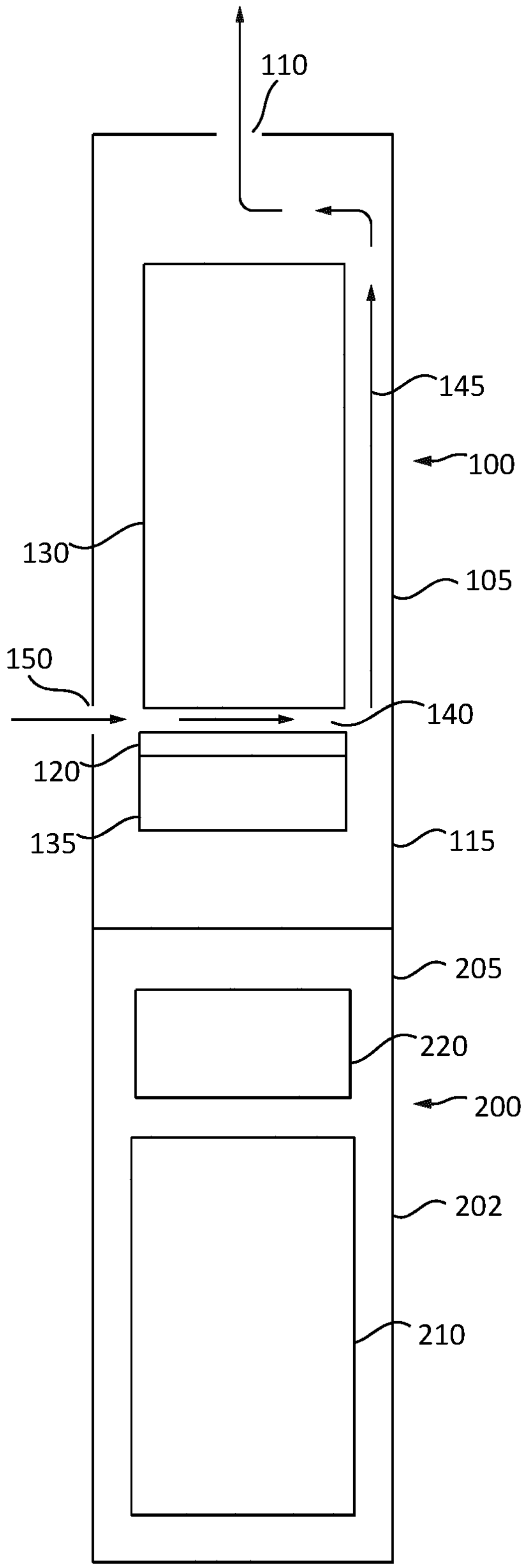
FIG. 1 shows a schematic illustration of an aerosol-generating system including an aerosol-generating device and a cartridge removably received by the aerosol-generating device in accordance with an example of the present disclosure.

As used herein, the term "resonant circuit" refers to an electrical circuit that exhibits resonance or resonant behaviour. That is, a resonant circuit naturally oscillates with greater amplitude at a certain frequency, called its resonant frequency, than at other frequencies.

Advantageously, by providing an aerosol-generating system with a resonant circuit, providing at least a portion of the resonant circuit in a cartridge of the system, and configuring the resonant circuit to resonate at a predetermined resonant frequency, an aerosol-generating device of the system is able to clearly identify the cartridge, or the aerosol-forming substrate contained in the cartridge, by determining resonant frequency of the resonant circuit. In other words, the resonant frequency acts as an identifying feature of the cartridge. Accordingly, aerosol-generating systems can be designed in which different resonant circuits, with different predetermined resonant frequencies, can be designed for cartridges having different aerosol-forming substrates, and an aerosol-generating device can use a determined resonant frequency of a resonant circuit to identify the cartridge received by the aerosol-generating device. Once a received cartridge has been identified by the aerosol-generating device, the aerosol-generating device can apply an appropriate heating profile for the aerosol-forming substrate contained in the cartridge.

Advantageously, the resonant circuit can be constructed from relatively few inexpensive electrical components and therefore the resonant circuit represents a simply and cost effective way of identifying a cartridge.

The resonant circuit may comprise any suitable number of components. Preferably, the resonant circuit may comprise three components or less. The resonant circuit may comprise two components or less. Reducing the number of components in the resonant circuit reduces the complexity and cost of the circuit, and also reduces the size of the circuit, that is, the circuit requires less printed circuit board area.

A further advantage of using a resonant circuit to identify a cartridge is that the resonant circuit can be used as an anti-counterfeiting measure. If a user connects an unauthorised cartridge to their aerosol-generating device that does not have a resonant circuit, or has a resonant circuit with a resonant frequency different to an expected predetermined resonant frequency, the aerosol-generating device may be able to identify the cartridge as unauthorised, or as a possible counterfeit, and either alert the user or block operation of the device.

A further advantage of using a resonant circuit to identify a cartridge, rather than other identification means, is that the cartridge is able to comprise only two electrical contacts for electrical connection with the aerosol-generating device. The two electrical contacts may be used for both supplying power to the heater for heating the aerosol-forming substrate, and also providing an input signal to, and receive an output signal from, the resonant circuit for identification of the cartridge.

The resonant circuit may comprise a capacitor and an inductor (a so-called LC circuit). This is the simplest type of resonant circuit and can be implemented with just two components.

For a resonant circuit comprising an inductor and a capacitor, resonance occurs when the circuit receives, or is driven by, an input alternating signal which is alternating or oscillating at the resonant frequency. The resonant frequency is the frequency at which the inductive and capacitive reactances of the resonant circuit are equal in magnitude. The resonant frequency of the resonant circuit can be determined by Equation (1):

$$f_0 = \frac{1}{2\pi\sqrt{LC}} \tag{1}$$

where $f_0$ is the resonant frequency, L is the inductance of the inductor and C is the capacitance of the capacitor.

The capacitor and inductor of the resonant circuit may be connected in series.

The capacitor and inductor of the resonant circuit may be connected in parallel.

In both series and parallel LC circuits, resonance occurs when the capacitive reactance and the inductive reactance are equal in magnitude but opposite in phase, such that the two reactances cancel each other. Therefore, when the series arrangement of the capacitor and inductor is resonating, the impedance of the resonant circuit is at a minimum, and when the parallel arrangement of the capacitor and inductor is resonating, the impedance of the resonant circuit is at a maximum.

In preferred embodiments, the cartridge comprises an electric heater for heating the aerosol-forming substrate.

In some preferred embodiments, the resonant circuit and the electric heater are connected in parallel. In some particularly preferred embodiments, the capacitor and inductor of the resonant circuit are arranged in series, and the resonant circuit and the electric heater are connected in parallel.

Advantageously, where the capacitor and inductor of the resonant circuit are arranged in series, and the resonant circuit and the electric heater are connected in parallel, and a direct current (DC) voltage is applied to the cartridge to heat the heater, the capacitor blocks DC voltage and the resonant circuit effectively acts as an open-circuit so that no direct current flows through the resonant circuit. Instead, direct current flows solely through the heater, and therefore energy losses in the resonant circuit are minimised during heating.

In some preferred embodiments, the resonant circuit comprises the electric heater.

In some particularly preferred embodiments, the electric heater comprises the inductor of the resonant circuit. The resonant circuit may comprise the electric heater and a capacitor. Preferably, the resonant circuit comprises the electric heater and a capacitor connected in parallel.

Advantageously, including the electric heater in the resonant circuit may simplify the resonant circuit, reducing the number of components required in the aerosol-generating system, and particularly in the cartridge. This may reduce material and manufacturing costs of the aerosol-generating system. Advantageously, where the electric heater and a capacitor are connected in parallel, and a direct current (DC) voltage is applied to the cartridge to heat the heater, the capacitor blocks DC voltage so that no direct current flows through the capacitor. Instead, direct current flows solely through the heater, and therefore energy losses in the resonant circuit are minimised during heating.

Preferably, wherein the resonant circuit comprises the electric heater, the electric heater comprises a coil having an inductance. In these embodiments, the resonant frequency of the resonant circuit may be varied by varying the inductance of the heater coil. The inductance of the heater coil may be varied by varying the geometric properties of the heater coil. In particular, the inductance of the heater coil may be varied by varying the number of turns of the heater coil. Advantageously, specific cartridges containing specific aerosol-forming substrates may be provided with heater coils having a particular number of turns, resulting in each cartridge containing a particular aerosol-forming substrate having a particular and identifiable resonant frequency due to the particular inductance of the coil heater resulting from the particular number of turns of the coil.

The predetermined resonant frequency of the resonant circuit may be determined by varying the capacitance of the capacitor. In this situation, the inductance of the inductor may be fixed. The inductance of the inductor may be fixed at 1 microhenry (μH), although any suitable inductance value may be used to achieve the predetermined resonant frequency. The capacitance of the capacitor may be varied by using capacitors having different capacitance values. Advantageously, varying the capacitance of the capacitor merely involves changing a single component for a particular resonant circuit. Any capacitor having a suitable capacitance value for achieving the predetermined resonant frequency may be used. The capacitance of the capacitor may be in the range of between about 0.1 nanofarads (nF) and about 200 nF. The capacitance of the capacitor may be varied by using a range of standard capacitor values. For example, the following capacitor values may be used: 0.27 nF, 0.39 nF, 0.56 nF, 0.82 nF, 1.2 nF, 1.8 nF, 2.7 nF, 3.9 nF, 5.6 nF, and 8.2 nF.

The predetermined resonant frequency of the resonant circuit may be determined by varying the inductance of the inductor. In this situation, the capacitance of the capacitor may be fixed. The capacitance of the capacitor may be fixed at about 10 nanofarads, although any suitable capacitance value may be used to achieve the predetermined resonant frequency. The inductance of the inductor may be varied by using inductors having different inductance values. Advantageously, varying the capacitance of the capacitor merely involves changing a single component for a particular resonant circuit. Any inductor having a suitable inductance value for achieving the predetermined resonant frequency may be used. The inductance of the inductor may be in the range of between about 1 nanohenries (nH) and about 10 microhenries (μH).

The predetermined resonant frequency of the resonant circuit may be determined by varying both the capacitance of the capacitor and the inductance of the inductor. Any suitable combination of capacitance and inductance values may be used to achieve the predetermined resonant frequency.

The predetermined resonant frequency may be in the range of between about 10 kilohertz (kHz) and about 100 megahertz (MHz). The predetermined resonant frequency may be in the range of between about 10 kilohertz (kHz) and about 50 megahertz (MHz).

The resonant circuit may comprise a plurality of capacitors arranged in parallel.

The resonant circuit may be arranged on a printed circuit-board (PCB). Where the cartridge comprises an electric heater, and the electric heater is not part of the resonant circuit, the resonant circuit may be arranged on its own separate PCB. This allows the resonant circuit to be manufactured as a separate modular part of the cartridge and act as a standalone identification or anti-counterfeiting device. Given that the resonant circuit can be implemented using relatively few components, less PCB area is required such that the PCB can easily fit within the cartridge of a handheld aerosol-generating device.

In some embodiments, the inductor is formed directly on the PCB as a conductive track. This can be fabricated easily during PCB manufacture and reduces the number of components required for the resonant circuit.

As mentioned above, the resonant circuit may comprise a capacitor connected in parallel with the electric heater. In some of these embodiments, the resonant circuit may be configured to use a parasitic inductance of the resonant circuit in combination with the capacitance of the capacitor to produce resonance. In particular, the resonant circuit comprises the electric heater, and where the electric heater does not comprise a coil, the resonant circuit may be configured to use a parasitic inductance of the resonant circuit in combination with the capacitance of the capacitor to produce resonance.

As used herein, the term “parasitic inductance” refers to an inevitable inductance effect of all “real” electronic components which can result from a number of factors such as the geometry of the component, the materials of the component or how the component is used in a circuit. For example, in addition to a resistance, a resistor may have a parasitic inductance and in addition to a capacitance, a capacitor may have a parasitic inductance. The term “real” above is used to distinguish actual physical components used in circuits from ideal components which exist purely in theory and have a single intended characteristic such as a pure resistance or a pure capacitance with no parasitic element. Generally, parasitic inductance is an unwanted inductance effect. Furthermore, its effect is often insignificant and in many applications it can be ignored. However, the inventors have surprisingly found that in certain applications it can be a benefit.

Advantageously, by using a parasitic inductance of the resonant circuit instead of an actual inductor component, the number of components in the resonant circuit can be reduced. This simplifies the circuit and reduces the PCB area required for the circuit.

Since parasitic inductances are often small, the resonant frequencies they produce are generally higher. The predetermined resonant frequency may be in the range of between about 10 kilohertz (kHz) and about 100 megahertz (MHz), and may be in the range of between about 10 kilohertz (kHz) and about 50 megahertz (MHz).

Where the resonant circuit may be configured to use a parasitic inductance of the resonant circuit in combination with the capacitance of the capacitor to produce resonance, the predetermined resonant frequency of the resonant circuit may be determined by varying the capacitance of the capacitor. This can be achieved by using capacitors having different capacitance values and merely involves changing a single component to change the resonant frequency for different resonant circuits. Any capacitor having a suitable capacitance value for achieving the predetermined resonant frequency may be used. The capacitance of the capacitor may be in the range of between about 1 nanofarads (nF) and about 100 nanofarads (nF). The capacitance of the capacitor may be varied by using a range of standard capacitor values. For example, the following capacitor values may be used: 2.7 nF, 3.9 nF, 5.6 nF, 8.2 nF, 12 nF, 18 nF, 27 nF, 39 nF, 56 nF, and 82 nF.

According to another example of the present disclosure, there is provided a cartridge for an aerosol-generating system. The cartridge may comprise an aerosol-forming substrate. In some embodiments, the cartridge may comprise one or more components of a resonant circuit, wherein an aerosol-generating device on which the cartridge is received comprises the other component or components of the resonant circuit, wherein the resonant circuit is configured to resonate at a predetermined resonant frequency, and wherein the predetermined resonant frequency is associated with an identity of the cartridge. In some embodiments, the cartridge comprises a resonant circuit, wherein the resonant circuit is configured to resonate at a predetermined resonant frequency, and wherein the predetermined resonant frequency is associated with an identity of the cartridge.

All features of the cartridge discussed herein may be applied to a cartridge or to an aerosol-generating system comprising such a cartridge.

In some preferred embodiments of the present disclosure, there is provided a cartridge for an aerosol-generating system, the cartridge comprising: an aerosol-forming substrate; and a resonant circuit, wherein the resonant circuit is configured to resonate at a predetermined resonant frequency, and wherein the predetermined resonant frequency is associated with an identity of the cartridge.

The cartridge may comprise an aerosol-forming substrate. As used herein, the term “aerosol-forming substrate” refers to a substrate capable of releasing volatile compounds that can form an aerosol. Volatile compounds may be released by heating the aerosol-forming substrate. Preferably, the cartridge contains a liquid aerosol-forming substrate.

The aerosol-forming substrate may be liquid at room temperature. The aerosol-forming substrate may comprise both liquid and solid components. The liquid aerosol-forming substrate may comprise nicotine. The nicotine containing liquid aerosol-forming substrate may be a nicotine salt matrix. The liquid aerosol-forming substrate may comprise plant-based material. The liquid aerosol-forming substrate may comprise tobacco. The liquid aerosol-forming substrate may comprise a tobacco-containing material containing volatile tobacco flavour compounds, which are released from the aerosol-forming substrate upon heating. The liquid aerosol-forming substrate may comprise homogenised tobacco material. The liquid aerosol-forming substrate may comprise a non-tobacco-containing material. The liquid aerosol-forming substrate may comprise homogenised plant-based material.

The liquid aerosol-forming substrate may comprise one or more aerosol-formers. An aerosol-former is any suitable known compound or mixture of compounds that, in use, facilitates formation of a dense and stable aerosol and that is substantially resistant to thermal degradation at the temperature of operation of the system. Examples of suitable aerosol formers include glycerine and propylene glycol. Suitable aerosol-formers are well known in the art and include, but are not limited to: polyhydric alcohols, such as triethylene glycol, 1,3-butanediol and glycerine; esters of polyhydric alcohols, such as glycerol mono-, di- or triacetate; and aliphatic esters of mono-, di- or polycarboxylic acids, such as dimethyl dodecanedioate and dimethyl tetradecanedioate. The liquid aerosol-forming substrate may comprise water, solvents, ethanol, plant extracts and natural or artificial flavours.

The liquid aerosol-forming substrate may comprise nicotine and at least one aerosol-former. The aerosol-former may be glycerine or propylene glycol. The aerosol former may comprise both glycerine and propylene glycol. The liquid aerosol-forming substrate may have a nicotine concentration of between about 0.5% and about 10%, for example about 2%.

In some preferred embodiments, the cartridge comprises a heater. In particular, the cartridge may comprise an electric heater.

The heater may comprise one or more heating elements. The heating element may have any suitable shape or geometry. For example, the heating element may be straight, formed as a coil or have an undulating or meandering shape. The heating element may comprise a heating wire or filament, for example a Ni—Cr (Nickel-Chromium), platinum, tungsten or alloy wire.

The heating element may be formed from any material with suitable electrical properties. Suitable materials include but are not limited to: semiconductors such as doped ceramics, electrically "conductive" ceramics (such as, for example, molybdenum disilicide), carbon, graphite, metals, metal alloys and composite materials made of a ceramic material and a metallic material. Such composite materials may comprise doped or undoped ceramics. Examples of suitable doped ceramics include doped silicon carbides. Examples of suitable metals include titanium, zirconium, tantalum and metals from the platinum group.

Examples of suitable metal alloys include stainless steel, constantan, nickel-, cobalt-, chromium-, aluminium-, titanium-, zirconium-, hafnium-, niobium-, molybdenum-, tantalum-, tungsten-, tin-, gallium-, manganese- and iron-containing alloys, and super-alloys based on nickel, iron, cobalt, stainless steel, TIMETAL®, iron-aluminium based alloys and iron-manganese-aluminium based alloys. TIMETAL® is a registered trademark of Titanium Metals Corporation. The filaments may be coated with one or more insulators. Preferred materials for the electrically conductive filaments are stainless steel and graphite, more preferably 300 series stainless steel like AISI 304, 316, 304L, 316L. Additionally, the electrically conductive heating element may comprise combinations of the above materials. A combination of materials may be used to improve the control of the resistance of the substantially flat heating element. For example, materials with a high intrinsic resistance may be combined with materials with a low intrinsic resistance. This may be advantageous if one of the materials is more beneficial from other perspectives, for example price, machinability or other physical and chemical parameters. Advantageously, high resistivity heaters allow more efficient use of battery energy.

The heating element may be a fluid-permeable heating element. The fluid permeable heating element may comprise a plurality of interstices or apertures extending from a first side to a second side of the heating element and through which fluid may pass.

The heating element may comprise a substantially flat heating element to allow for simple manufacture. Geometrically, the term "substantially flat" heating element is used to refer to a heating element that is in the form of a substantially two dimensional topological manifold. Thus, the substantially flat heating element extends in two dimensions along a surface substantially more than in a third dimension. In particular, the dimensions of the substantially flat heating element in the two dimensions within the surface is at least five times larger than in the third dimension, normal to the surface. An example of a substantially flat heating element is a structure between two substantially imaginary parallel surfaces, wherein the distance between these two imaginary surfaces is substantially smaller than the extension within the surfaces. In some embodiments, the substantially flat heating element is planar. In other embodiments, the substantially flat heating element is curved along one or more dimensions, for example forming a dome shape or bridge shape.

The heating element may comprise a plurality of electrically conductive filaments. The term "filament" is used to refer to an electrical path arranged between two electrical contacts. A filament may arbitrarily branch off and diverge into several paths or filaments, respectively, or may converge from several electrical paths into one path. A filament may have a round, square, flat or any other form of cross-section. A filament may be arranged in a straight or curved manner.

The heating element may be an array of filaments, for example arranged parallel to each other. Preferably, the filaments may form a mesh. The mesh may be woven or non-woven. The mesh may be formed using different types of weave or lattice structures. Alternatively, the electrically conductive heating element consists of an array of filaments or a fabric of filaments. The mesh, array or fabric of electrically conductive filaments may also be characterized by its ability to retain liquid.

In a preferred example, a substantially flat heating element may be constructed from a wire that is formed into a wire mesh. Preferably, the mesh has a plain weave design. Preferably, the heating element is a wire grill made from a mesh strip.

The electrically conductive filaments may define interstices between the filaments and the interstices may have a width of between 10 micrometres and 100 micrometres. Preferably, the filaments give rise to capillary action in the interstices, so that in use, liquid to be vaporized is drawn into the interstices, increasing the contact area between the heating element and the liquid aerosol-forming substrate.

The electrically conductive filaments may form a mesh of size between 60 and 240 filaments per centimetre (+/−10 percent). Preferably, the mesh density is between 100 and 140 filaments per centimetres (+/−10 percent). More preferably, the mesh density is approximately 115 filaments per centimetre. The width of the interstices may be between 100 micrometres and 25 micrometres, preferably between 80 micrometres and 70 micrometres, more preferably approximately 74 micrometres. The percentage of open area of the mesh, which is the ratio of the area of the interstices to the total area of the mesh may be between 40 percent and 90 percent, preferably between 85 percent and 80 percent, more preferably approximately 82 percent.

The electrically conductive filaments may have a diameter of between 8 micrometres and 100 micrometres, preferably between 10 micrometres and 50 micrometres, more preferably between 12 micrometres and 25 micrometres, and most preferably approximately 16 micrometres. The filaments may have a round cross section or may have a flattened cross-section.

The area of the mesh, array or fabric of electrically conductive filaments may be small, for example less than or equal to 50 square millimetres, preferably less than or equal to 25 square millimetres, more preferably approximately 15 square millimetres. The size is chosen such to incorporate the heating element into a handheld system. Sizing of the mesh, array or fabric of electrically conductive filaments less or equal than 50 square millimetres reduces the amount of total power required to heat the mesh, array or fabric of electrically conductive filaments while still ensuring sufficient contact of the mesh, array or fabric of electrically conductive filaments to the liquid aerosol-forming substrate. The mesh, array or fabric of electrically conductive filaments may, for example, be rectangular and have a length between 2 millimetres to 10 millimetres and a width between 2 millimetres and 10 millimetres. Preferably, the mesh has dimensions of approximately 5 millimetres by 3 millimetres.

Preferably, the filaments are made of wire. More preferably, the wire is made of metal, most preferably made of stainless steel.

The electrical resistance of the mesh, array or fabric of electrically conductive filaments of the heating element may be between 0.3 Ohms and 4 Ohms. Preferably, the electrical resistance is equal or greater than 0.5 Ohms. More preferably, the electrical resistance of the mesh, array or fabric of electrically conductive filaments is between 0.6 Ohms and 0.8 Ohms, and most preferably about 0.68 Ohms. The electrical resistivity of the mesh, array or fabric of electrically conductive filaments is preferably at least an order of magnitude, and more preferably at least two orders of magnitude, greater than the electrical resistivity of any electrically conductive contact portions. This ensures that the heat generated by passing current through the heating element is localized to the mesh or array of electrically conductive filaments. It is advantageous to have a low overall resistance for the heating element if the system is powered by a battery. A low resistance, high current system allows for the delivery of high power to the heating element. This allows the heating element to heat the electrically conductive filaments to a desired temperature quickly.

In some embodiments, the heating element may comprise a heating plate in which an array of apertures is formed. The apertures may be formed by etching or machining, for example. The plate may be formed from any material with suitable electrical properties, such as the materials described above in relation to the heating element.

Electrical contact portions may be positioned on opposite ends of the heating element. The electrical contact portions may comprise two electrically conductive contact pads. The electrically conductive contact pads may be positioned at an edge area of the heating element. Preferably, the at least two electrically conductive contact pads may be positioned on extremities of the heating element. An electrically conductive contact pad may be fixed directly to electrically conductive filaments of the heating element. An electrically conductive contact pad may comprise a tin patch. Alternatively, an electrically conductive contact pad may be integral with the heating element.

The cartridge may comprise a liquid storage compartment. Liquid aerosol-forming substrate may be held in the liquid storage compartment.

In some preferred embodiments, the liquid storage compartment has first and second portions in communication with one another. A first portion of the liquid storage compartment may be on an opposite side of the heater to the second portion of the liquid storage compartment. Liquid aerosol-forming substrate may be held in the first portion of the liquid storage compartment.

Advantageously, the first portion of the storage compartment is larger than the second portion of the storage compartment. The cartridge may be configured to allow a user to draw or suck on the cartridge to inhale aerosol generated in the cartridge. In use a mouth end opening of the cartridge is typically positioned above the heater, with the first portion of the storage compartment positioned between the mouth end opening and the heater. Having the first portion of the storage compartment larger than the second portion of the storage compartment ensures that liquid is delivered from the first portion of the storage compartment to the second portion of the storage compartment, and so to the heater, during use, under the influence of gravity.

The cartridge may have a mouth end through which generated aerosol can be drawn by a user. The cartridge may have a connection end configured to connect the cartridge to an aerosol-generating device.

The connection end of the cartridge may comprise electrical contacts for electrical connection of the cartridge to the aerosol-generating device. The cartridge may comprise any suitable number of electrical contacts for electrical connection of the cartridge to the aerosol-generating device. For example, the cartridge may comprise two, three, four, five or six electrical contacts for electrical connection of the cartridge to the aerosol-generating device. Preferably, the cartridge comprises only two electrical contacts for electrical connection of the cartridge to the aerosol-generating device.

Where the heater comprises a substantially flat heating element, a first side of the heater may face the mouth end and a second side of the heater faces the connection end.

The cartridge may define an enclosed airflow path or passage from an air inlet past the first side of the heater to a mouth end opening of the cartridge. The enclosed airflow passage may pass through the first or second portion of the liquid storage compartment. In one embodiment the air flow path extends between the first and second portions of the liquid storage compartment. The air flow passage may extend through the first portion of the liquid storage compartment. For example, the first portion of the liquid storage compartment may have an annular cross section, with the air flow passage extending from the heater to the mouth end portion through the first portion of the liquid storage compartment. Alternatively, the air flow passage may extend from the heater to the mouth end opening adjacent to the first portion of the liquid storage compartment.

The cartridge may comprise a capillary material. The capillary material may fluidly connect the liquid storage compartment to the heater. A portion of the capillary material may be positioned in the liquid storage portion, and a portion of the capillary material may be positioned out of the liquid storage portion to the heater.

Where the heater comprises a coil heating element, the coil heating element may be wound around a portion of the liquid storage portion positioned out of the liquid storage portion.

Where the heater comprises a substantially flat heating element having a first side facing the mouth end and a second side of the heater facing the connection end, the cartridge may comprise a capillary material in contact with the second side of the heater. Such a capillary material may deliver liquid aerosol-forming substrate to the heater against the force of gravity. By requiring the liquid aerosol forming substrate to be move against the force of gravity in use to reach the heater, the possibility of large droplets of the liquid entering the airflow passage is reduced.

A capillary material is a material that is capable of transport of liquid from one end of the material to another by means of capillary action. The capillary material may have a fibrous or spongy structure. The capillary material preferably comprises a bundle of capillaries. For example, the capillary material may comprise a plurality of fibres or threads or other fine bore tubes. The fibres or threads may be generally aligned to convey liquid aerosol-forming substrate towards the heating element. In some embodiments, the capillary material may comprise sponge-like or foam-like material. The structure of the capillary material may form a plurality of small bores or tubes, through which the liquid aerosol-forming substrate can be transported by capillary action. Where the heater comprises interstices or apertures, the capillary material may extend into interstices or apertures in the heater. The heater may draw liquid aerosol-forming substrate into the interstices or apertures by capillary action.

The capillary material may comprise any suitable material or combination of materials. Examples of suitable materials are a sponge or foam material, ceramic- or graphite-based materials in the form of fibres or sintered powders, foamed metal or plastics material, a fibrous material, for example made of spun or extruded fibres, such as cellulose acetate, polyester, or bonded polyolefin, polyethylene, terylene or polypropylene fibres, nylon fibres or ceramic. The capillary material may have any suitable capillarity and porosity so as to be used with different liquid physical properties. The liquid aerosol-forming substrate has physical properties, including but not limited to viscosity, surface tension, density, thermal conductivity, boiling point and vapour pressure, which allow the liquid aerosol-forming substrate to be transported through the capillary medium by capillary action.

In some embodiments, the cartridge contains a retention material for holding a liquid aerosol-forming substrate. The retention material may be positioned in the liquid storage compartment. Where the liquid storage compartment comprises a first portion and a second portion, the retention material may be positioned in the first portion of the liquid storage compartment, the second portion of the storage compartment or both the first and second portions of the storage compartment. The retention material may be a foam, a sponge or a collection of fibres. The retention material may be formed from a polymer or co-polymer. In one embodiment, the retention material is a spun polymer. The liquid aerosol-forming substrate may be released into the retention material during use. For example, the liquid aerosol-forming substrate may be provided in a capsule.

The cartridge may comprise a retention material and a capillary material.

The cartridge may comprise a housing. The housing may be formed form a mouldable plastics material, such as polypropylene (PP) or polyethylene terephthalate (PET). The housing may form a part or all of a wall of one or both portions of the liquid storage compartment. The housing and liquid storage compartment may be integrally formed. Alternatively the liquid storage compartment may be formed separately from the housing and assembled to the housing.

According to another example of the present disclosure, there is provided an aerosol-generating device for use with a cartridge including a resonant circuit. The aerosol-generating device may include a housing configured to removably receive the cartridge. The aerosol-generating device may include a power source for supplying power to the cartridge. The aerosol-generating device may comprise control circuitry comprising a controller configured to: determine the resonant frequency of the resonant circuit when the cartridge is received by the aerosol-generating device; and identify the cartridge based on the determined resonant frequency.

In some embodiments, the aerosol-generating device may comprise one or more components of a resonant circuit, wherein a cartridge received by the aerosol-generating device comprises the other component or components of the resonant circuit, wherein the resonant circuit is configured to resonate at a predetermined resonant frequency, and wherein the predetermined resonant frequency is associated with an identity of a cartridge.

All features of the aerosol-generating device discussed herein may be applied to an aerosol-generating device or to an aerosol-generating system comprising such an aerosol-generating device.

In some preferred embodiments of the present disclosure, there is provided an aerosol-generating device for use with a cartridge including a resonant circuit, the aerosol-generating device comprising: a housing configured to removably receive the cartridge; a power source for supplying power to the cartridge; and control circuitry comprising a controller configured to: determine the resonant frequency of the resonant circuit when the cartridge is received by the aerosol-generating device; and identify the cartridge based on the determined resonant frequency.

The aerosol-generating device comprises control circuitry. The control circuitry comprises a controller. The controller is configured to determine the resonant frequency of the resonant circuit when the cartridge is received by the aerosol-generating device. The controller is also configured to identify the cartridge based on the determined resonant frequency. The control circuitry may be configured in any suitable manner to enable the controller to determine the resonant frequency of the resonant circuit when the cartridge is received by the aerosol-generating device, and identify the cartridge based on the determined resonant frequency.

In some embodiments, the control circuitry may be configured to measure the duration of an oscillation of an oscillating signal from the resonant circuit to determine the resonant frequency of the resonant circuit.

In some embodiments, the control circuitry may be configured to measure the number of oscillations in a predetermined period of time of an oscillating signal from the resonant circuit to determine the resonant frequency of the resonant circuit.

In some preferred embodiments, the control circuitry is configured to form an oscillator with the resonant circuit of the cartridge. The oscillator is configured to generate an oscillating signal with a frequency equal to the predetermined resonant frequency of the resonant circuit. Preferably, the oscillator is powered from a direct current (DC) voltage source.

The oscillator may comprise a voltage comparator. A suitable exemplary voltage comparator is the LM311 from Texas Instruments Incorporated. The output of the voltage comparator may be supplied to the controller. The controller may be configured to determine the frequency of the output of the controller.

The oscillator may be a multivibrator. In particular, the oscillator may be an astable multivibrator configured to switch between two states, a high state and a low state, in response to an oscillating signal from the resonant circuit. The oscillator may be a free running multivibrator.

Advantageously, configuring the control circuitry to form an oscillator with the resonant circuit of the cartridge may enable the aerosol-generating device to determine the resonant frequency of the resonant circuit without supplying an oscillating signal to the resonant circuit. This may reduce the complexity and the cost of the circuitry of the aerosol-generating device.

In some embodiments, the controller may be configured to measure the duration of one or more oscillations of the output signal of the oscillator to determine the frequency of the output signal, and accordingly determine the resonant frequency of the resonant circuit. In some embodiments, the controller may be configured to count the number of oscillations of the output signal of the oscillator in a predetermined period of time to determine the frequency of the output signal, and accordingly determine the resonant frequency of the resonant circuit.

The oscillator may be configured to produce a square wave signal with a frequency equal to the resonant frequency of the resonant circuit. In other words, the output signal of the oscillator may be generated in discrete pulses.

In some embodiments, the controller may be configured to measure the duration of one or more pulses of the output signal of the oscillator to determine the frequency of the output signal, and accordingly determine the resonant frequency of the resonant circuit. This method may be most suitable for low frequencies, such as frequencies in the kilohertz range. This is because the sampling rate of the controller is required to increase as the frequency increases, in order to be able to discriminate between changes in frequency. The sampling rate of the controller may be any suitable sampling rate. The sampling rate of the controller may be at least 5 Megasamples per second (Msps), preferably at least 10 Megasamples per second, more preferably at least 100 Megasamples per second, and even more preferably at least 130 Megasamples per second.

In some preferred embodiments, the controller may be configured to count the number of pulses of the output signal of the oscillator in a predetermined period of time to determine the frequency of the output signal, and accordingly determine the resonant frequency of the resonant circuit. In other words, the controller may be configured with a counter for counting the number of pulses during a predetermined period of time. The predetermined period of time may be any suitable period. For example, the predetermined period of time may be between about 1 millisecond and about 1 second, or between about 1 millisecond and about 500 milliseconds, or between about 10 milliseconds and about 100 milliseconds.

Where the cartridge comprises an electric heater, preferably the controller is configured to prevent supply of power to the electric heater for heating the aerosol-forming substrate when the resonant frequency of the resonant circuit is being determined. Advantageously, preventing supply of power to the electric heater for heating the aerosol-forming substrate when the resonant frequency of the resonant circuit is being determined may reduce interference in the oscillating signal from the oscillator.

The controller is also configured to identify the cartridge based on the determined resonant frequency. The controller may identify the cartridge, or the aerosol-forming substrate contained in the cartridge, in any suitable manner.

In some embodiments, the controller is configured to interrogate a look-up table stored in a memory of the controller, and compare the determined resonant frequency with one or more reference resonant frequencies stored in the look-up table.

Put in another way, the controller may comprise a memory storing one or more reference resonant frequency values, each reference resonant frequency value being associated with a particular cartridge identity. The controller is configured to compare a determined resonant frequency value measured from the resonant circuit to the reference resonant frequency values stored in the look-up table. Where the determined resonant frequency value matches a reference resonant frequency value stored in the look-up table, the cartridge identity is determined to be the cartridge identity associated with the matched reference resonant frequency value.

It will be appreciated that ranges of reference frequency values may be stored in the look-up table, and each range of reference resonant frequency values may be associated with a particular cartridge identity. When a determined resonant frequency value is compared to the ranges of resonant frequency values, and the determined resonant frequency value falls within a range of reference resonant frequency values, the cartridge identity is determined to be the cartridge identity associated with the range of reference frequency values in which the determined resonant frequency value fell.

The controller may be configured to control the supply of power from the power source of the aerosol-generating device to the electric heater of the cartridge based on the determined identity of the cartridge.

In some embodiments, the controller may be configured to prevent power from being supplied from the power supply to the electric heater if the identity of the cartridge is not recognised. In other words, if the determined resonant frequency does not equal an expected resonant frequency value, the controller may be configured to prevent power from being supplied from the power source to the electric heater. In embodiments in which a look-up table of reference resonant frequency values is stored in a memory of the controller, the controller may be configured to prevent power from being supplied to the electric heater when the determined resonant frequency does not match any of the stored reference resonant frequency values. Advantageously, preventing power from being supplied to the electric heaters when the determined resonant frequency does not match an expected resonant frequency may prevent or inhibit unauthorised cartridges from being used with an aerosol-generating device.

In some embodiments, the controller may be configured to adjust the power supplied from the power supply to the electric heater based on the determined identity of the cartridge. This may enable the aerosol-generating device to heat different aerosol-forming substrates, contained in different cartridges, to different temperatures.

Advantageously, configuring the controller to adjust the power supplied to the electric heater based on the determined cartridge identity may enable the aerosol-generating device to be used with different types of cartridge, containing different aerosol-forming substrates. Since different aerosol-forming substrates may require heating to different temperatures to achieve an aerosol with the desired characteristics, adjusting the power supplied to the heater based on the determined cartridge identity may ensure that the aerosol-generating device is configured to generate an optimal aerosol from different cartridges, containing different aerosol-forming substrates.

In some embodiments, the controller may be configured to supply a first power to the electric heater when a first cartridge identity is determined, and the controller may be further configured to supply a second power, different to the first power, to the electric heater when a second cartridge identity, different to the first cartridge identity, is determined.

The control circuitry comprises a controller. The controller may comprise a microprocessor. The microprocessor may be a programmable microprocessor, a microcontroller, or an application specific integrated chip (ASIC) or other electronic circuitry capable of providing control. The control circuitry may comprise further electronic components. For example, in some embodiments, the control circuitry may comprise any of: sensors, switches, display elements. Power may be supplied to the aerosol-generating element continuously following activation of the device or may be supplied intermittently, such as on a puff-by-puff basis. The power may be supplied to the aerosol-generating element in the form of pulses of electrical current, for example, by means of pulse width modulation (PWM). The power source may be a battery. The battery may be a lithium iron phosphate battery, within the device. As an alternative, the power source may be another form of charge storage device such as a capacitor.

The power source may be a DC power supply. The power source may be a battery. The battery may be a Lithium based battery, for example a Lithium-Cobalt, a Lithium-Iron-Phosphate, a Lithium Titanate or a Lithium-Polymer battery. The battery may be a Nickel-metal hydride battery or a Nickel cadmium battery. The power source may be another form of charge storage device such as a capacitor. The power source may be rechargeable and be configured for many cycles of charge and discharge. The power source may have a capacity that allows for the storage of enough energy for one or more user experiences; for example, the power source may have sufficient capacity to allow for the continuous generation of aerosol for a period of around six minutes, corresponding to the typical time taken to smoke a conventional cigarette, or for a period that is a multiple of six minutes. In another example, the power source may have sufficient capacity to allow for a predetermined number of puffs or discrete activations of the atomiser assembly.

The aerosol-generating device may comprise a housing. The housing may be elongate. The housing may comprise any suitable material or combination of materials. Examples of suitable materials include metals, alloys, plastics or composite materials containing one or more of those materials, or thermoplastics that are suitable for food or pharmaceutical applications, for example polypropylene, polyetheretherketone (PEEK) and polyethylene. The material is preferably light and non-brittle.

The aerosol-generating device may have a connection end configured to connect the aerosol-generating device to a cartridge.

The connection end of the aerosol-generating device may comprise electrical contacts for electrical connection of the aerosol-generating device to the cartridge. The aerosol-generating device may comprise any suitable number of electrical contacts for electrical connection of the aerosol-generating device to the cartridge. For example, the aerosol-generating device may comprise two, three, four, five or six electrical contacts for electrical connection of the aerosol-generating device to the cartridge. Preferably, the aerosol-generating device comprises only two electrical contacts for electrical connection of the aerosol-generating device to the cartridge.

The aerosol-generating device may have a distal end, opposite the connection end. The distal end may comprise an electrical connector configured to connect the aerosol-generating device to an electrical connector of an external power source, for charging the power source of the aerosol-generating device.

According to the present disclosure, there is provided an aerosol-generating system comprising a cartridge as described herein and an aerosol-generating device as described herein.

The aerosol-generating system may be a handheld aerosol-generating system configured to allow a user to puff on a mouthpiece to draw an aerosol through a mouth end opening. The aerosol-generating system may have a size comparable to a conventional cigar or cigarette. The aerosol-generating system may have a total length between about 30 mm and about 150 mm. The aerosol-generating system may have an external diameter between about 5 mm and about 30 mm.

The invention is defined in the claims. However, below there is provided a non-exhaustive list of non-limiting examples. Any one or more of the features of these examples may be combined with any one or more features of another example, embodiment, or aspect described herein.

Example Ex1. An aerosol-generating system comprising:
- a cartridge including an aerosol-forming substrate;
- a resonant circuit, wherein the cartridge comprises at least a portion of the resonant circuit, and the resonant circuit is configured to resonate at a predetermined resonant frequency, and wherein the predetermined resonant frequency is associated with an identity of the cartridge; and
- an aerosol-generating device including:
  - a housing configured to removably receive the cartridge;
  - a power source for supplying power to the cartridge; and
  - control circuitry comprising a controller configured to:
    - determine the resonant frequency of the resonant circuit when the cartridge is received by the aerosol-generating device; and
    - identify the cartridge based on the determined resonant frequency.

Example Ex2. An aerosol-generating system according to example Ex1, wherein the cartridge includes an electric heater for heating the aerosol-forming substrate.

Example Ex3. An aerosol-generating system according to example Ex2, wherein the resonant circuit comprises the electric heater.

Example Ex4. An aerosol-generating system according to example Ex3, wherein the electric heater comprises a coil having an inductance.

Example Ex5. An aerosol-generating system according to any one of examples Ex1 to Ex4, wherein the resonant circuit comprises a capacitor and an inductor.

Example Ex6. An aerosol-generating system according to example Ex5, wherein the capacitor and inductor are connected in series.

Example Ex7. An aerosol-generating system according to example Ex5, wherein the capacitor and inductor are connected in parallel.

Example Ex8. An aerosol-generating system according to any one of examples Ex5, Ex6 or Ex7, wherein the cartridge comprises the inductor.

Example Ex9. An aerosol-generating system according to example Ex8, wherein the predetermined resonant frequency of the resonant circuit is determined by varying the inductance of the inductor of the resonant circuit.

Example Ex10. An aerosol-generating system according to example Ex4, wherein the resonant circuit comprises a capacitor and an inductor, wherein the electric heater comprises a coil having an inductance, and wherein the electric heater comprises the inductor of the resonant circuit.

Example Ex11. An aerosol-generating system according to example Ex10, wherein the capacitor of the resonant circuit is connected in parallel with the electric heater.

Example Ex12. An aerosol-generating system according to any one of example Ex8 to Ex11, wherein the cartridge comprises the capacitor.

Example Ex13. An aerosol-generating system according to any one of examples Ex8 to Ex12, wherein the cartridge comprises the resonant circuit.

Example Ex14. An aerosol-generating system according to any one of examples Ex8 to Ex11, wherein the aerosol-generating device comprises the capacitor.

Example Ex15. An aerosol-generating system according to any one of examples Ex5, Ex6 or Ex7, wherein the cartridge comprises the capacitor.

Example Ex16. An aerosol-generating system according to example Ex15, wherein the predetermined resonant frequency of the resonant circuit is determined by varying the capacitance of the capacitor of the resonant circuit.

Example Ex17. An aerosol-generating system according to examples Ex15 or Ex16, wherein the aerosol-generating device comprises the inductor.

Example Ex18. An aerosol-generating system according to any one of examples Ex5 to Ex17, wherein the resonant circuit comprises a plurality of capacitors connected in parallel.

Example Ex19. An aerosol-generating system according to any one of examples Ex5 to Ex18, wherein the resonant circuit comprises a capacitor, and the predetermined resonant frequency of the resonant circuit is dependent on the capacitance of the capacitor and a parasitic inductance of the resonant circuit.

Example Ex20. An aerosol-generating system according to any one of examples Ex5 to Ex19, wherein the capacitance of the capacitor is in the range of between about 0.1 nanofarads (nF) and about 200 nanofarads (nF).

Example Ex21. An aerosol-generating system according to any one of examples Ex5 to Ex20, wherein the inductance of the inductor is in the range of between about 1 nanohenries (nH) and about 10 microhenries (μH).

Example Ex22. An aerosol-generating system according to any one of examples Ex1 to Ex21, wherein the predetermined resonant frequency is in the range of between about 10 kilohertz (kHz) and about 100 megahertz (MHz).

Example Ex23. An aerosol-generating system according to any one of examples Ex1 to Ex22, wherein the resonant circuit is arranged on a printed circuit board (PCB).

Example Ex24. An aerosol-generating system according to any one of examples Ex1 to Ex23, wherein the control circuitry is configured to form an oscillator with the resonant circuit, the oscillator being configured to generate an oscillating signal with a frequency at the predetermined resonant frequency of the resonant circuit.

Example Ex25. An aerosol-generating system according to example Ex24, wherein the control circuitry is configured to measure the frequency of the oscillating signal from the oscillator.

Example Ex26. An aerosol-generating system according to example Ex25, wherein the control circuitry is configured to measure the duration of an oscillation of the oscillating signal from the oscillator to determine the resonant frequency of the resonant circuit.

Example Ex27. An aerosol-generating system according to example Ex25, wherein the control circuitry is configured to measure the number of oscillations in a predetermined period of time of the oscillating signal from the oscillator to determine the resonant frequency of the resonant circuit.

Example Ex28. A cartridge for an aerosol-generating system, the cartridge comprising:

an aerosol-forming substrate; and a resonant circuit, wherein the resonant circuit is configured to resonate at a predetermined resonant frequency, and wherein the predetermined resonant frequency is associated with an identity of the cartridge.

Example Ex29. A cartridge according to example Ex28, wherein the cartridge includes an electric heater for heating the aerosol-forming substrate.

Example Ex30. A cartridge according to example Ex29, wherein the resonant circuit comprises the electric heater.

Example Ex31. A cartridge according to example Ex30, wherein the electric heater comprises a coil having an inductance.

Example Ex32. A cartridge according to any one of examples Ex28 to 31, wherein the resonant circuit comprises a capacitor and an inductor.

Example Ex33. A cartridge according to example Ex32, wherein the capacitor and inductor are connected in series.

Example Ex34. A cartridge according to example Ex32, wherein the capacitor and inductor are connected in parallel.

Example Ex35. A cartridge according to example Ex31, wherein the resonant circuit comprises a capacitor and an inductor, and wherein the electric heater comprises the inductor.

Example Ex36. A cartridge according to example Ex35, wherein the capacitor of the resonant circuit is connected in parallel with the electric heater.

Example Ex37. A cartridge according to any one of examples Ex32 to Ex36, wherein the resonant circuit comprises a plurality of capacitors connected in parallel.

Example Ex38. A cartridge according to any one of examples Ex28 to Ex31, wherein the resonant circuit comprises a capacitor, and the predetermined resonant frequency of the resonant circuit is dependent on the capacitance of the capacitor and a parasitic inductance of the resonant circuit.

Example Ex39. A cartridge according to any one of examples Ex32 to Ex38, wherein the capacitance of the capacitor is in the range of between about 0.1 nanofarads (nF) and about 200 nanofarads (nF).

Example Ex40. A cartridge according to any one of examples Ex32 to Ex37, wherein the inductance of the inductor is in the range of between about 1 nanohenries (nH) and about 10 microhenries (pH).

Example Ex41. A cartridge according to any one of examples Ex28 to Ex40, wherein the predetermined resonant frequency is in the range of between about 10 kilohertz (kHz) and about 100 megahertz (MHz).

Example Ex42. A cartridge according to any one of examples Ex28 to Ex40, wherein the resonant circuit is arranged on a printed circuit board (PCB).

Example Ex43. An aerosol-generating device for use with a cartridge including a resonant circuit, the aerosol-generating device including:

a housing configured to removably receive the cartridge;

a power source for supplying power to the cartridge; and control circuitry comprising a controller configured to:

determine the resonant frequency of the resonant circuit when the cartridge is received by the aerosol-generating device; and identify the cartridge based on the determined resonant frequency.

Example Ex44. An aerosol-generating device according to example Ex43, wherein the control circuitry is configured to form an oscillator with the resonant circuit of the cartridge, the oscillator being configured to generate an oscillating signal with a frequency at the predetermined resonant frequency of the resonant circuit.

Example Ex45. An aerosol-generating device according to example Ex44, wherein the control circuitry is configured to measure the frequency of the oscillating signal from the oscillator.

Example Ex46. An aerosol-generating device according to example Ex45, wherein the control circuitry is configured to measure the duration of an oscillation of the oscillating signal from the oscillator to determine the resonant frequency of the resonant circuit.

Example Ex47. An aerosol-generating device according to example Ex45, wherein the control circuitry is configured to measure the number of oscillations in a predetermined period of time of the oscillating signal from the oscillator to determine the resonant frequency of the resonant circuit.

FIG. 1 shows a schematic illustration of an example of an aerosol-generating system in accordance with the present invention. The aerosol-generating system comprises two main components, a cartridge 100 and a main body part 200. A connection end 115 of the cartridge 100 is removably connected to a corresponding connection end 205 of the main body part 200. The main body part 200 contains a battery 210, which in this example is a rechargeable lithium ion battery, and control circuitry 220. The aerosol-generating system is portable and has a size comparable to a conventional cigar or cigarette. A mouthpiece is arranged at the end of the cartridge 100 opposite the connection end 115.

The cartridge 100 comprises a housing 105 containing a heater assembly 120 and a liquid storage compartment having a first portion 130 and a second portion 135. A liquid aerosol-forming substrate is held in the liquid storage compartment. Although not illustrated in FIG. 1, the first portion 130 of the liquid storage compartment is connected to the second portion 135 of the liquid storage compartment so that liquid in the first portion 130 can pass to the second portion 135. The heater assembly 120 receives liquid from the second portion 135 of the liquid storage compartment. In this embodiment, the heater assembly 120 comprises a fluid permeable heating element.

An air flow passage 140, 145 extends through the cartridge 100 from an air inlet 150 formed in a side of the housing 105 past the heater assembly 120 and from the heater assembly 120 to a mouthpiece opening 110 formed in the housing 105 at an end of the cartridge 100 opposite to the connection end 115.

The components of the cartridge 100 are arranged so that the first portion 130 of the liquid storage compartment is between the heater assembly 120 and the mouthpiece opening 110, and the second portion 135 of the liquid storage compartment is positioned on an opposite side of the heater assembly 100 to the mouthpiece opening 110. In other words, the heater assembly 120 lies between the two portions 130, 135 of the liquid storage compartment and receives liquid from the second portion 135. The first portion 130 of liquid storage compartment is closer to the mouthpiece opening 110 than the second portion 135 of the liquid storage compartment. The air flow passage 140, 145 extends past the heater assembly 110 and between the first 130 and second 135 portion of the liquid storage compartment.

The main body part 200 comprises a housing 202 containing the battery 210 and control circuitry 220.

The system is configured so that a user can puff or draw on the mouthpiece opening 110 of the cartridge to draw aerosol into their mouth. In operation, when a user puffs on the mouthpiece opening 110, air is drawn through the airflow passage 140, 145 from the air inlet 150, past the heater assembly 120, to the mouthpiece opening 110. The control circuitry 220 controls the supply of electrical power from the battery 210 to the cartridge 100 when the system is activated. This in turn controls the amount and properties of the vapour produced by the heater assembly 120. The control circuitry 220 may include an airflow sensor (not shown) and the control circuitry 220 may supply electrical power to the heater assembly 120 when user puffs on the cartridge 100 are detected by the airflow sensor. This type of control arrangement is well established in aerosol-generating systems such as inhalers and e-cigarettes. So when a user puffs on the mouthpiece opening 110 of the cartridge 100, the heater assembly 120 is activated and generates a vapour that is entrained in the air flow passing through the air flow passage 140. The vapour cools within the airflow in passage 145 to form an aerosol, which is then drawn into the user's mouth through the mouthpiece opening 110.

In operation, the mouthpiece opening 110 is typically the highest point of the system. The construction of the cartridge 100, and in particular the arrangement of the heater assembly 120 between first and second portions 130, 135 of the liquid storage compartment, is advantageous because it exploits gravity to ensure that the liquid substrate is delivered to the heater assembly 120 even as the liquid storage compartment is becoming empty, but prevents an oversupply of liquid to the heater assembly 120 which might lead to leakage of liquid into the air flow passage 140.

Figure 2:
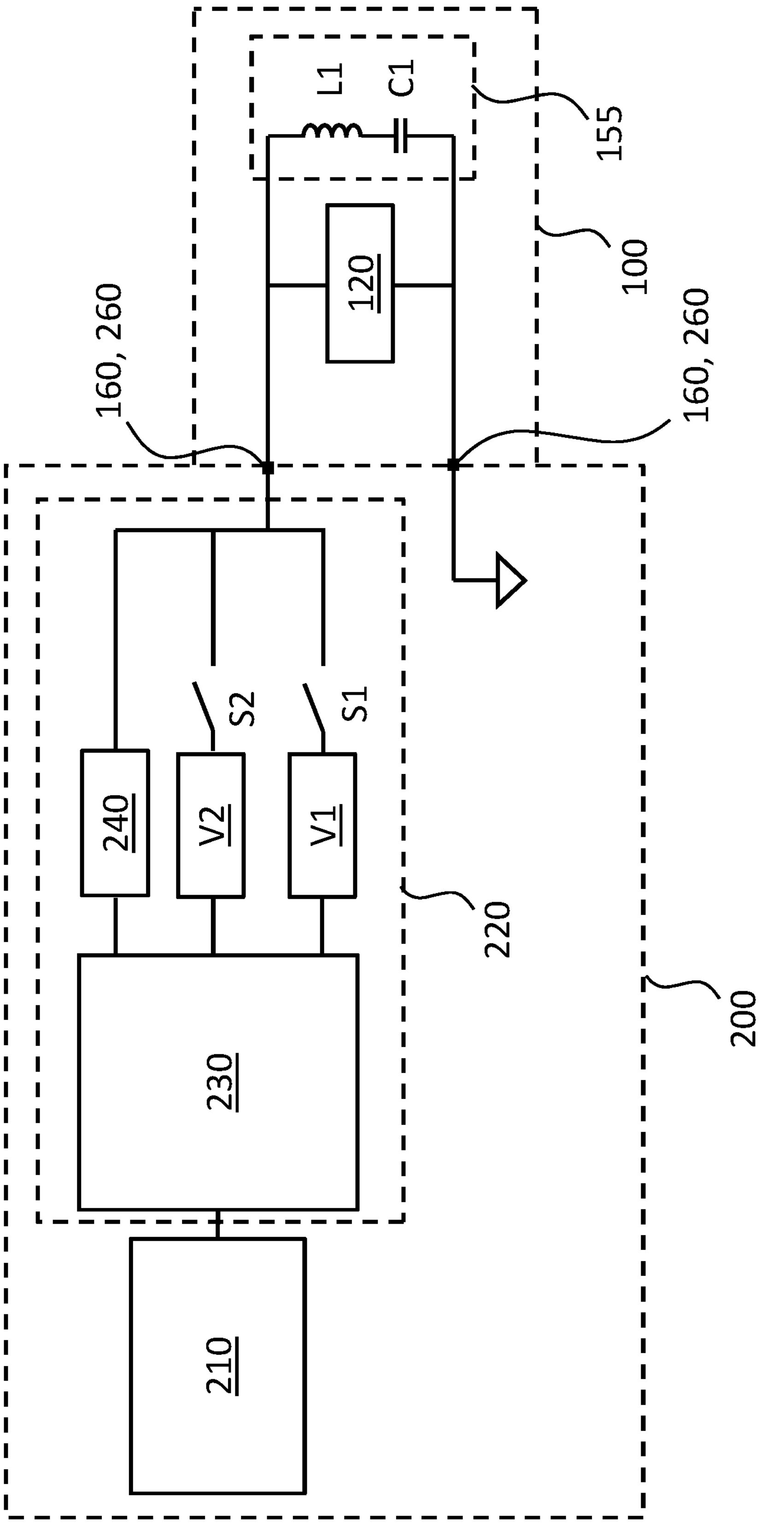
FIG. 2 shows a block diagram of the main electrical components of the aerosol-generating system of FIG. 1.

FIG. 2 shows a block diagram illustrating the main electric and electronic components of the aerosol-generating system of FIG. 1, comprising the cartridge 100 and the aerosol-generating device 200. The cartridge 100 comprises the electric heater 120 connected in parallel with a resonant circuit 155 (not shown in FIG. 1). The resonant circuit 155 is configured to resonate at a predetermined resonant frequency, which is associated with an identity of the cartridge 100. By determining the resonant frequency of the resonant circuit 155, the aerosol-generating device 200 is able to identify the cartridge 100, and the aerosol-forming substrate contained in the cartridge 100, and control the supply of power to the electric heater 120 to generate the appropriate temperature to generate the optimal aerosol from the aerosol-forming substrate.

The resonant circuit 155 comprises an inductor L1 and a capacitor C1 connected in series. The resonant circuit 155 is connected in parallel across the electric heater 120.

With this arrangement of the resonant circuit 155 and the electric heater 120, only two electrical connections are required between the cartridge 100 to the aerosol-generating device 200. The two electrical connections can be used to supply power to the heater 120 for heating the aerosol-forming substrate, and to provide an input signal to the resonant circuit 155, and to receive an output signal from the resonant circuit 155 for determining the resonant frequency of the resonant circuit 155, and determining the identity of the cartridge 100. Accordingly, the cartridge 100 comprises a single pair of electrical contacts 160, for electrical connection with the aerosol-generating device 200.

The aerosol-generating device 200 comprises the battery 210, which acts as a power source, and the control circuitry 220, which controls the supply of power from the battery 210 to the cartridge 100. The aerosol-generating device 200 further comprises a single pair of electrical contacts 260, complementary to the pair of electrical contacts 160 of the cartridge 100, for electrical connection of the aerosol-generating device 200 with the cartridge 100.

The control circuitry 220 comprises a microcontroller (MCU) 230. The microcontroller 230 is configured to control the supply of electrical power to the electric heater 120, which is shown in FIG. 2 by a DC voltage source V1 and a switch S1, which may be a transistor or other suitable electronic switch. The microcontroller 230 modulates the DC voltage source V1 through pulse width modulation (PWM) to provide power to the electric heater 120 in a series of pulses. The power to the electric heater 120 is controlled by controlling the duty cycle of the series of pulses, which controls the temperature of the electric heater 120. No passive components which can generate heat, such as resistors or inductors, are connected in series between the DC voltage source V1 and the electric heater 120. This helps to reduce energy losses during heating of the electric heater 120.

The control circuitry 220 also comprises identification circuitry 240, which is connected to the resonant circuit 155. The microcontroller 230 is also configured to control the supply of electrical power to the resonant circuit 155, via the identification circuitry 240. The configuration of the microcontroller 230 for controlling the supply of electrical power to the resonant circuit 155 via the identification circuitry 240 is shown in FIG. 2 by a DC voltage source V2 and a switch S2, which may be a transistor or other suitable electronic switch. The microcontroller 230 is further configured to receive an output signal from the identification circuitry 240, and determine the resonant frequency of the resonant circuit 155 from the output signal of the identification circuitry 240, as described in more detail below in relation to FIG. 3.

Although two separate voltage sources V1 and V2 are shown separate from the microcontroller 230 in FIG. 2, it will be appreciated that in practice both of these voltage sources are provided by the microcontroller 230. It will also be appreciated in some embodiments the aerosol-generating device may actually comprise two separate power sources, such as two separate batteries, which may separately form the voltage sources V1 and V2.

Figure 3:
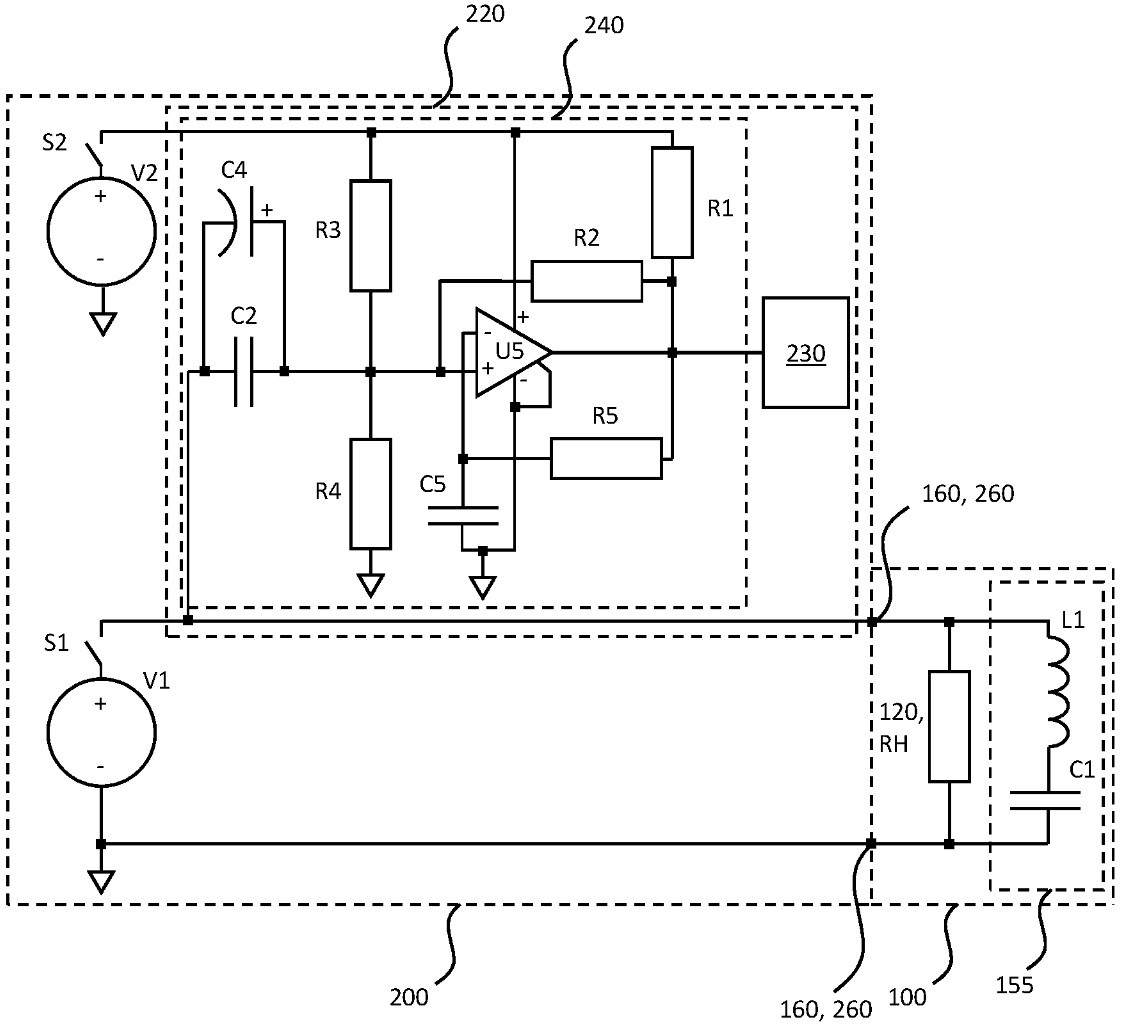
FIG. 3 shows a schematic circuit diagram of the electrical circuit of the aerosol-generating system of FIG. 1.

FIG. 3 shows a schematic circuit diagram of the electrical circuit of the aerosol-generating system of FIGS. 1 and 2.

The cartridge 100 comprises the electric heater 120 and the resonant circuit 155 connected in parallel. The electric heater 120 is a resistive heater, and as such, is indicated in FIG. 3 as RH. The resonant circuit 155 comprises the capacitor C1 and the inductor L1 connected in series.

In this embodiment, the resistive heater RH is taken to have no inductance, and as such, is not shown forming part of the resonant circuit 155. However, it will be appreciated that in other embodiments the resistive heater RH may have an inductance and may form part of the resonant circuit 155.

The cartridge 100 comprises a pair of electrical contacts 160, which electrically connect the cartridge 100 to the aerosol-generating device 200 when the cartridge 100 is received by the aerosol-generating device 200, via a complementary pair of electrical contacts 260 on the aerosol-generating device 200.

The aerosol-generating device 200 comprises control circuitry 220, including the microcontroller 230 and the identification circuitry 240. The battery 210 of the aerosol-generating device 200 is not shown in FIG. 3, but the first DC voltage source V1, switch S1, the second DC voltage source V2, and the switch S2 illustrated above in FIG. 2 are shown.

As shown in FIG. 3, the first voltage source V1 is directly connected to the electric heater RH. It will be appreciated that in other embodiments the voltage source V2 may be indirectly connected to the electric heater RH, such as via a resistor. The microcontroller 230 and first voltage source V1 are configured to provide pulses of power to the electric heater RH for heating the aerosol-forming substrate in the cartridge 100. The duty cycle of the pulses of power from the first voltage source V1 is controlled by the microcontroller 230 via pulse width modulation (PWM) to control the temperature of the electric heater RH. The capacitor C1 of the resonant circuit, which is connected in parallel with the electric heater RH, prevents DC current from being drawn through the inductor L1, and hence minimises current losses through the inductor L1 when the pulses of power are supplied from the first voltage source V1 to the electric heater RH for heating the aerosol-forming substrate.

Also as shown in FIG. 3, the second voltage source V2 is directly connected to the identification circuitry 240. The identification circuitry 240 is connected to the resonant circuit 155 in the cartridge 100 via the same rail that connects the first voltage source V1 to the heater RH. An output of the identification circuitry 240 is connected to the microcontroller 230.

In this embodiment, the identification circuit 240 is configured as an oscillator, which outputs a square wave signal having a frequency equal to the predetermined resonant frequency of the resonant circuit 155.

The identification circuit 240 comprises a voltage comparator U5. In this embodiment the comparator U5 is an LM311 from Texas Instruments Incorporated, however, it will be appreciated that other comparators may be used.

The second voltage source V2 is connected to the positive supply terminal (pin 8) of the voltage comparator U5. The second voltage source V2 is also connected to the non-inverting input (pin 2) of the voltage comparator U5, via a voltage divider comprising equal 100 kiloohm resistors R3 and R4. A feedback loop from the output (pin 7) of the voltage comparator U5 to the non-inverting input (pin 2) of the voltage comparator U5 is provided, via a 10 kiloohm resistor R2. A 1 kiloohm resistor R1 is also provided between the second voltage source V2, the output (pin 7) of the voltage comparator U5, and the resistor R2, in order to provide a voltage drop between the second voltage supply V2 and the output of the voltage comparator U5. A 22 nanofarad capacitor C5, is connected to the inverting input (pin 3) of the voltage comparator U5, and is also connected to the output (pin 7) of the comparator U5 via a resistor R5 of 100 kiloohms. The non-inverting input (pin 2) of the voltage comparator U5 is also connected to the cartridge 100 via a 100 nanofarad capacitor C2, arranged in parallel with a 10 microfarad electrolytic capacitor C4. The capacitors C2 and C4 are decoupling capacitors that permit AC oscillations to pass between the resonant circuit 155 and the identification circuit 240, while preventing DC signals from passing between the resonant circuit 155 and the identification circuit 240. The capacitor C2 is provided to permit the passage of high frequencies, and the electrolytic capacitor C4 is provided to permit the passage of low frequencies.

When the switch S2 is closed, and the second voltage source V2 is connected to the identification circuit, the voltage at the non-inverting input of the voltage comparator U5 is about half V2 (which is about 1.5 Volts if we use an example where V2 is about 3 Volts), due to the voltage divider formed by the equal resistors R3 and R4. This input results in an output from the voltage comparator U5 of about V2 (about 3 Volts). The output of the voltage comparator U5 charges the capacitor C5 through resistor R5, until the voltage at the inverting input of the voltage comparator U5 is also about half V2 (about 1.5 Volts). As the inverting input of the voltage comparator U5 reaches about half V2 (about 1.5 Volts), which is the same voltage as the non-inverting input, the output of the voltage comparator U5 switches to a low level, inducing a transient voltage into the identification circuit. This transient voltage is fed to the resonant circuit 155 in the cartridge 100 via the resistor R2 and the capacitors C2 and C4, and maintain the resonant circuit 155 to resonate at the predetermined resonant frequency of the resonant circuit 155. The resonating resonant circuit 155 affects the voltage at the non-inverting input of the voltage comparator U5, which causes a square wave to be generated at the output of the voltage comparator U5 with a frequency at the predetermined resonant frequency of the resonant circuit 155. The square wave output from the voltage comparator U5 is fed back to the resonant circuit 155 through resistor R2 and capacitor C2, which sustains the resonant oscillation of the resonant circuit. The square wave output from the voltage comparator U5 is also fed back to the capacitor C5 through the resistor R5, which in turn induces an AC signal at the inverting input of the voltage comparator U5. The phase difference between the output from the voltage comparator U5 and the AC signal at the inverting input of the voltage comparator U5 causes the output of the voltage comparator U5 to be a square wave signal.

The square wave output from the voltage comparator U5 is supplied to the microcontroller 230, which is configured to determine the frequency of the square wave output.

In this example, the microcontroller 230 is configured to determine the resonant frequency of the resonant circuit 155 by determining the frequency of the square wave output of the identification circuit 240 by counting the number of oscillations or pulses in a predetermined time period of around 100 milliseconds. It will be appreciated that other predetermined time periods may be used, such as between about 10 milliseconds and about 200 milliseconds. It will also be appreciated that in other embodiments the microcontroller 230 may be configured to determine the resonant frequency of the resonant circuit 155 by determining the frequency of the square wave output by measuring the duration of one or more oscillations or pulses.

In this example, the microcontroller 230 is configured to disconnect the first voltage source V1 from the electric heater RH, via the switch S1, before the second voltage source V2 is connected to the identification circuit 240, via the switch S2. Advantageously, this reduces interference from the first voltage source V1 in the square wave output of the identification circuitry 240.

In this example, the microcontroller 230 comprises a memory (not shown) storing a look-up table comprising a plurality of reference resonant frequency values, with each reference resonant frequency value being associated with a particular cartridge identity, and power value. Each associated cartridge identity relates to the particular aerosol-forming substrate contained in the cartridge. Each associated power value corresponds to the power required to be supplied to the electric heater to generate the optimal aerosol from the particular aerosol-forming substrate contained in the cartridge.

The microcontroller 230 is configured to determine the identity of the cartridge 100 based on the determined resonant frequency by comparing the determined resonant frequency to the plurality of reference resonant frequency values stored in the look-up table.

When the determined resonant frequency matches one of the stored reference resonant frequency values, the microcontroller 230 is configured to determine the identity of the cartridge 100 to be the cartridge identity associated with the matched reference resonant frequency value in the look-up table. The microcontroller 230 is further configured to control the first voltage source V1 to supply power to the electric heater RH in the cartridge 100 in accordance with the power value associated with cartridge identity in the look-up table.

When the determined resonant frequency does not match any of the stored reference resonant frequency values in the look-up table, the microcontroller 230 is configured to determine that the cartridge is an unauthorised cartridge. When the microcontroller 230 determines that a cartridge is unauthorised, the microcontroller 230 is configured to prevent power from being supplied from the first voltage source V1 to the electric heater RH to heat the aerosol-forming substrate in the cartridge.

Figure 4:
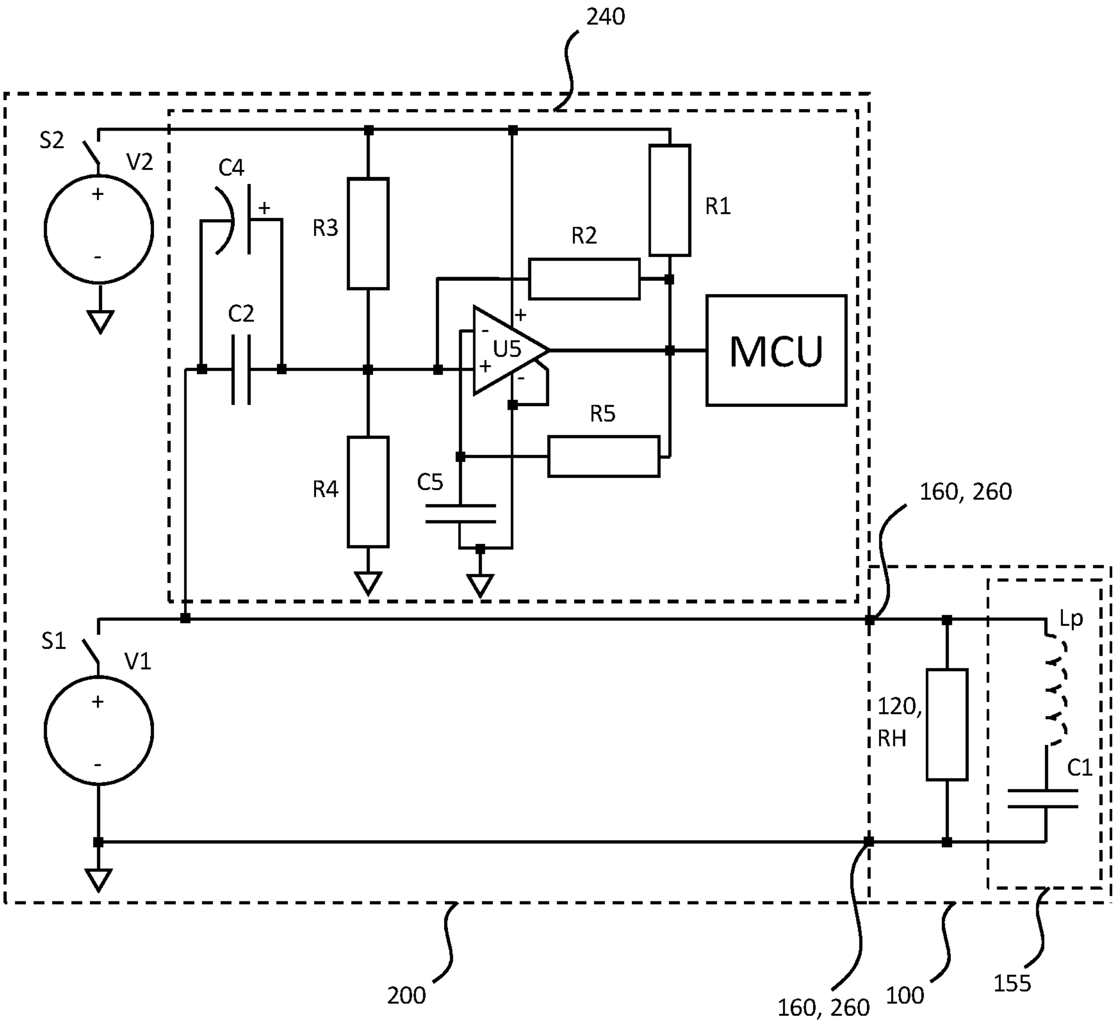
FIG. 4 shows a schematic circuit diagram of an alternative example of an electrical circuit suitable for the aerosol-generating system of FIG. 1.

FIG. 4 shows a schematic circuit diagram of an alternative example of an electrical circuit suitable for the aerosol-generating system of FIG. 1. The example circuit of FIG. 4 is substantially the same as the example circuit of FIG. 3, and as such, equivalent features have been given equivalent reference numerals.

The only difference between the example circuit of FIG. 3 and the example circuit of FIG. 4 is that the resonant circuit 155 of the example circuit of FIG. 4 does not comprise the inductor L1 of the example circuit of FIG. 3. The example circuit of FIG. 4 uses the parasitic inductance Lp of the resonant circuit 155, which is primarily comprised of the parasitic inductance of the capacitor C1, instead of the inductor L1 of the example circuit of FIG. 3. In this embodiment, the heater RH is considered to have no inductance. However, it will be appreciated that in most embodiments, the heater RH will have an appreciable inductance, and will contribute to the parasitic inductance Lp of the resonant circuit 155. In some embodiments, the parasitic inductance of the heater RH is significantly higher than the parasitic inductance of the other components in the resonant circuits, and in these embodiments the resonant frequency of the resonant circuit is primarily determined by the capacitance of the capacitor C1 and the inductance of the heater RH.

The parasitic inductance Lp of the resonant circuit 155 is typically significantly lower than the inductance of a "real" inductor, such as the inductor L1 of the example circuit of FIG. 3. Accordingly, the resonant frequency of the resonant circuit 155 of the example circuit of FIG. 4 is typically significantly higher than the resonant frequency of a resonant circuit including a "real" inductor, such as the example circuit of FIG. 3.

Advantageously, using the parasitic inductance of the resonant circuit without providing a "real" inductor may reduce the complexity of the resonant circuit, and reduce the cost of the components of the cartridge.

Figure 5:
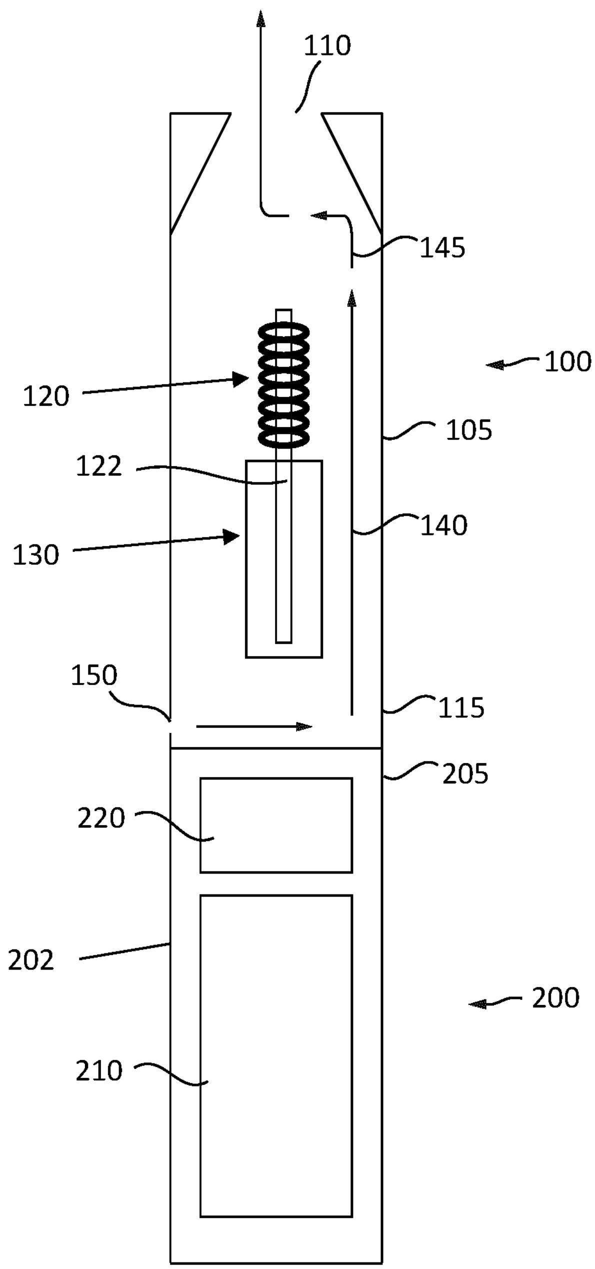
FIG. 5 shows a schematic illustration of an aerosol-generating system including an aerosol-generating device and a cartridge removably received by the aerosol-generating device in accordance with another example of the present disclosure.
Figure 6:
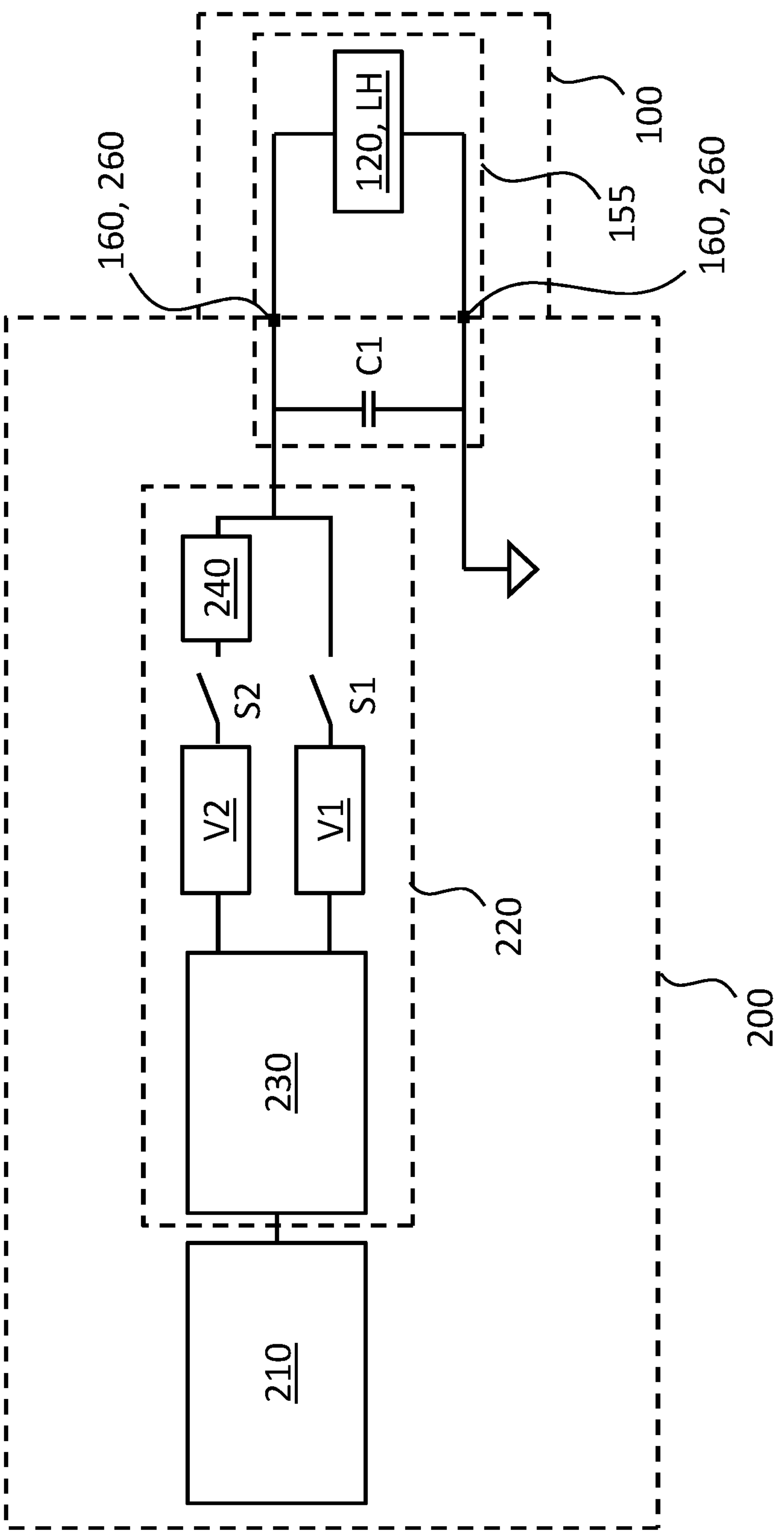
FIG. 6 shows a block diagram of the main electrical components of the aerosol-generating system of FIG. 5.
Figure 7:
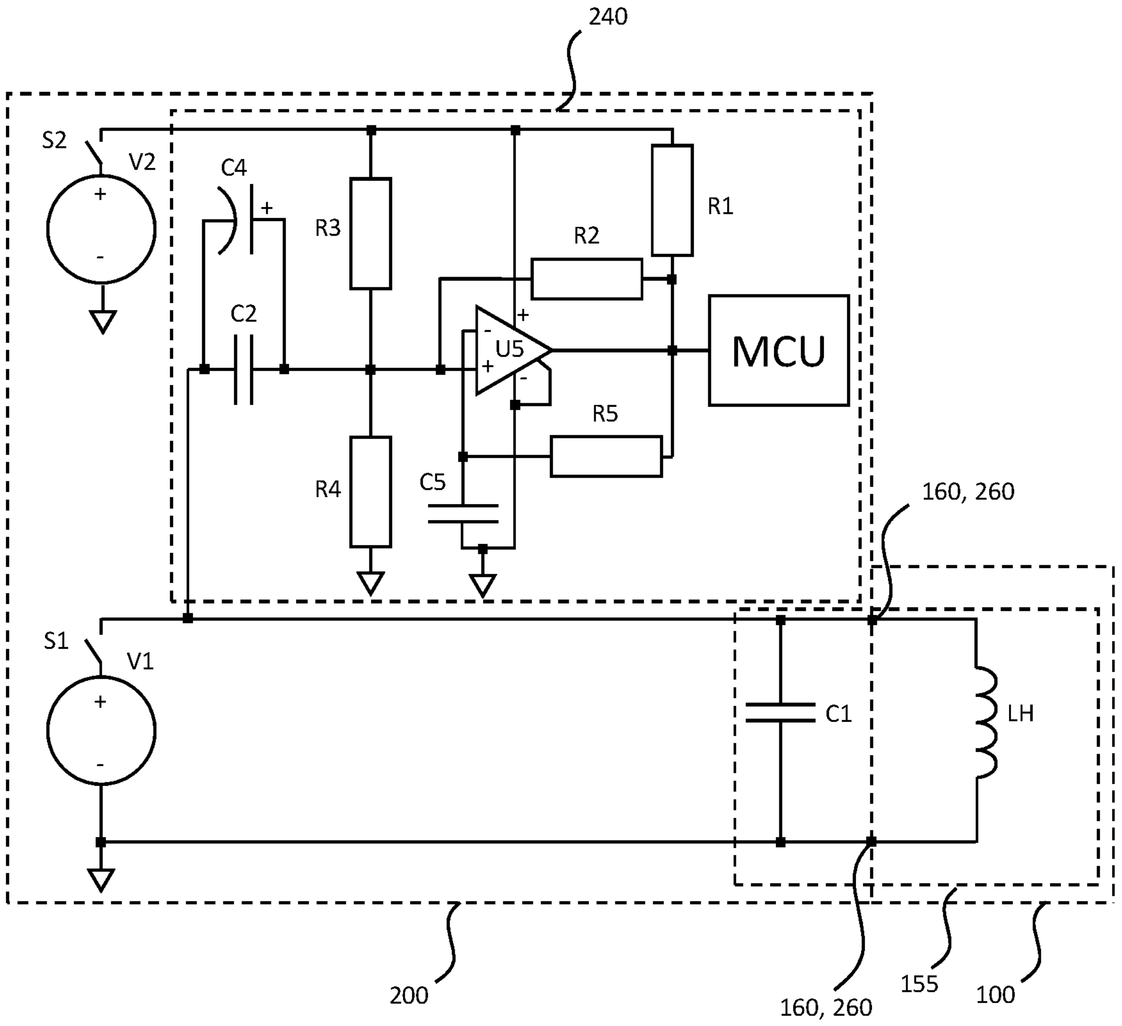
FIG. 7 shows a schematic circuit diagram of the electrical circuit of the aerosol-generating system of FIG. 1.

FIG. 5 shows a schematic illustration of another example of an aerosol-generating system in accordance with the present invention. The aerosol-generating system of FIGS. 5, 6 and 7 is substantially similar to the aerosol-generating system of FIG. 1, and as such, equivalent features have been given equivalent reference numerals.

The aerosol-generating system comprises two main components, a cartridge 100 and a main body part 200. A connection end 115 of the cartridge 100 is removably connected to a corresponding connection end 205 of the main body part 200. The main body part comprises a battery 210, which in this example is a rechargeable lithium ion battery, and control circuitry 220. The aerosol-generating system is portable and has a size comparable to a conventional cigar or cigarette. A mouthpiece is arranged at the end of the cartridge 100 opposite the connection end 115.

The cartridge 100 comprises a housing 105 containing a heater assembly 120 and a liquid storage compartment 130. A liquid aerosol-forming substrate is held in the liquid storage compartment.

In this embodiment, the heater assembly 120 comprises a heating element in the form of heating coil. The heater assembly 120 receives liquid from the liquid storage compartment 130 via a capillary wick 122. One end of the capillary wick 122 is positioned in the liquid storage compartment 130 and the other end of the capillary wick 122 is positioned outside of the liquid storage compartment 130 and is surrounded by the heating coil 120.

An air flow passage 140, 145 extends through the cartridge 100 from an air inlet 150 formed in a side of the housing 105 past the heater assembly 120 and from the heater assembly 120 to a mouthpiece opening 110 formed in the housing 105 at an end of the cartridge 100 opposite to the connection end 115.

The main body part 200 comprises a housing 202 containing the battery 210 and control circuitry 220.

The system is configured so that a user can puff or draw on the mouthpiece opening 110 of the cartridge to draw aerosol into their mouth. In operation, when a user puffs on the mouthpiece opening 110, air is drawn through the airflow passage 140, 145 from the air inlet 150, past the heater assembly 120, to the mouthpiece opening 110. The control circuitry 220 controls the supply of electrical power from the battery 210 to the cartridge 100 when the system is activated. This in turn controls the amount and properties of the vapour produced by the heater assembly 120. The control circuitry 220 may include an airflow sensor (not shown) and the control circuitry 220 may supply electrical power to the heater assembly 120 when user puffs on the cartridge 100 are detected by the airflow sensor. This type of control arrangement is well established in aerosol-generating systems such as inhalers and e-cigarettes. So when a user puffs on the mouthpiece opening 110 of the cartridge 100, the heater assembly 120 is activated and generates a vapour that is entrained in the air flow passing through the air flow passage 140. The vapour cools within the airflow in passage 145 to form an aerosol, which is then drawn into the user's mouth through the mouthpiece opening 110.

FIG. 6 shows a block diagram illustrating the main electric and electronic components of the aerosol-generating system of FIG. 5, comprising the cartridge 100 and the aerosol-generating device 200.

The cartridge 100 comprises the electric heater 120, in the form of a heater coil. Due to the geometry of the heater coil 120, the heater coil 120 forms an inductor, and as such, the heater coil 120 is also referred to in FIGS. 6 and 7 as LH.

The aerosol-generating device 200 comprises a capacitor C1. When the cartridge 100 is received by the aerosol-generating device 200, the heater coil LH and the capacitor C1 are connected in parallel, and form a resonant circuit 155 (not shown in FIG. 5). The resonant circuit 155 is configured to resonate at a predetermined resonant frequency, which is associated with an identity of the cartridge 100. By determining the resonant frequency of the resonant circuit 155, the aerosol-generating device 200 is able to identify the cartridge 100, and the aerosol-forming substrate contained in the cartridge 100, and control the supply of power to the electric heater 120 to generate the appropriate temperature to generate the optimal aerosol from the aerosol-forming substrate.

The resonant frequency of the resonant circuit 155 is associated with the identity of the cartridge through the inductance of the heater coil LH. The inductance of the heater coil LH may be varied between cartridges containing different aerosol-forming substrates, such that the resonant frequency of the resonant circuit 155 for each cartridge is associated with the liquid aerosol-forming substrate in the cartridge. Advantageously, dividing components of the resonant circuit between the aerosol-generating device and the cartridge may reduce the number of components in the cartridge, lowering the complexity and cost of the cartridge.

With this arrangement of the heater coil LH and the capacitor C1, only two electrical connections are required between the cartridge 100 and the aerosol-generating device 200. The two electrical connections can be used to supply power to the heater coil LH for heating the aerosol-forming substrate, and to provide an input signal to the resonant circuit 155, and to receive an output signal from the resonant circuit 155 for determining the resonant frequency of the resonant circuit 155, and determining the identity of the cartridge 100. Accordingly, the cartridge 100 comprises a single pair of electrical contacts 160, for electrical connection with the aerosol-generating device 200.

The aerosol-generating device 200 comprises the battery 210, which acts as a power source, and the control circuitry 220, which controls the supply of power from the battery 210 to the cartridge 100. The aerosol-generating device 200 further comprises a single pair of electrical contacts 260, complementary to the pair of electrical contacts 160 of the cartridge 100, for electrical connection of the aerosol-generating device 200 with the cartridge 100.

The control circuitry 220 comprises a microcontroller (MCU) 230. The microcontroller 230 is configured to control the supply of electrical power to the heater coil LH, which is shown in FIG. 6 by a DC voltage source V1 and a switch S1, which may be a transistor or other suitable electronic switch. The microcontroller 230 modulates the DC voltage source V1 through pulse width modulation (PWM) to provide power to the heater coil in a series of pulses. The power to the heater coil LH is controlled by controlling the duty cycle of the series of pulses, which controls the temperature of the heater coil LH. No passive components which can generate heat, such as resistors or inductors, are connected in series between the DC voltage source V1 and the heater coil LH. This helps to reduce energy losses during heating of the heater coil LH.

The control circuitry 220 also comprises identification circuitry 240, which is connected to the resonant circuit 155. The microcontroller 230 is also configured to control the supply of electrical power to the resonant circuit 155, via the identification circuitry 240. The configuration of the microcontroller 230 for controlling the supply of electrical power to the resonant circuit 155 via the identification circuitry 240 is shown in FIG. 6 by a DC voltage source V2 and a switch S2, which may be a transistor or other suitable electronic switch. The microcontroller 230 is further configured to receive an output signal from the identification circuitry 240, and determine the resonant frequency of the resonant circuit 155 from the output signal of the identification circuitry 240, as described above in relation to FIGS. 3 and 4.

Although two separate voltage sources V1 and V2 are shown separate from the microcontroller 230 in FIG. 6, it will be appreciated that in practice both of these voltage sources are provided by the microcontroller 230. It will also be appreciated in some embodiments the aerosol-generating device may actually comprise two separate power sources, such as two separate batteries, which may separately form the voltage sources V1 and V2.

FIG. 7 shows a schematic circuit diagram of an example of an electrical circuit suitable for the aerosol-generating system of FIG. 5. The example circuit of FIG. 7 is substantially the same as the example circuit of FIG. 3, and as such, equivalent features have been given equivalent reference numerals.

The first difference between the example circuit of FIG. 3 and the example circuit of FIG. 7 is that the resonant circuit 155 of the example circuit of FIG. 7 comprises a heater coil LH, which also forms the inductor of the resonant circuit 155. Accordingly, the resonant circuit 155 of the example circuit of FIG. 7 does not comprise the separate heater 120 and inductor L1 of the example circuit of FIG. 3.

The second difference between the example circuit of FIG. 3 and the example circuit of FIG. 7 is that the cartridge 100 does not comprise the entire resonant circuit 155. The cartridge 100 of the example circuit of FIG. 7 does not comprise the capacitor C1 of the resonant circuit 155. In the example circuit of FIG. 7, the aerosol-generating device comprises the capacitor C1 of the resonant circuit 155.

Advantageously, using the parasitic inductance of the resonant circuit without providing a "real" inductor may reduce the complexity of the resonant circuit, and reduce the cost of the components of the cartridge.

Advantageously, dividing components of the resonant circuit between the aerosol-generating device and the cartridge may reduce the number of components in the cartridge, lowering the complexity and cost of the cartridge.

For the purpose of the present description and of the appended claims, except where otherwise indicated, all numbers expressing amounts, quantities, percentages, and so forth, are to be understood as being modified in all instances by the term "about". Also, all ranges include the maximum and minimum points disclosed and include any intermediate ranges therein, which may or may not be specifically enumerated herein. In this context, therefore, a number A is understood as A±{5%} of A. Within this context, a number A may be considered to include numerical values that are within general standard error for the measurement of the property that the number A modifies. The number A, in some instances as used in the appended claims, may deviate by the percentages enumerated above provided that the amount by which A deviates does not materially affect the basic and novel characteristic(s) of the claimed invention. Also, all ranges include the maximum and minimum points disclosed and include any intermediate ranges therein, which may or may not be specifically enumerated herein.

The invention claimed is:

1. An aerosol-generating system, comprising:

a cartridge including an aerosol-forming substrate;

a resonant circuit, wherein the cartridge comprises at least a portion of the resonant circuit, wherein the resonant circuit is configured to resonate at a predetermined resonant frequency, and wherein the predetermined resonant frequency is associated with an identity of the cartridge; and an aerosol-generating device including:

a housing configured to removably receive the cartridge, a power source configured to supply power to the cartridge, and control circuitry comprising a controller configured to:

determine a resonant frequency of the resonant circuit when the cartridge is received by the aerosol-generating device, and identify the cartridge based on the determined resonant frequency, wherein the cartridge has a connection end configured to connect the cartridge to the aerosol-generating device, the connection end of the cartridge comprising electrical contacts configured to electrically connect the cartridge to the aerosol-generating device, and wherein the aerosol-generating device has a connection end configured to connect the aerosol-generating device to the cartridge, the connection end of the aerosol-generating device comprising electrical contacts configured to electrically connect the aerosol-generating device to the cartridge.

2. The aerosol-generating system according to claim 1, wherein the cartridge further includes an electric heater configured to heat the aerosol-forming substrate, and wherein the resonant circuit comprises the electric heater.

3. The aerosol-generating system according to claim 1, wherein the resonant circuit comprises a capacitor and an inductor.

4. The aerosol-generating system according to claim 3, wherein the cartridge comprises the inductor.

5. The aerosol-generating system according to claim 1, wherein the resonant circuit comprises a capacitor and an inductor, wherein the cartridge further includes an electric heater configured to heat the aerosol-forming substrate, wherein the resonant circuit comprises the electric heater, and wherein the electric heater comprises a coil and forms the inductor of the resonant circuit.

6. The aerosol-generating system according to claim 4, wherein the capacitor of the resonant circuit is connected in parallel with the inductor.

7. The aerosol-generating system according to claim 3, wherein the cartridge comprises the capacitor.

8. The aerosol-generating system according to claim 1, wherein the cartridge comprises the resonant circuit.

9. The aerosol-generating system according to claim 3, wherein the aerosol-generating device comprises the capacitor.

10. The aerosol-generating system according to claim 1, wherein the resonant circuit comprises a capacitor, and the predetermined resonant frequency of the resonant circuit is dependent on a capacitance of the capacitor and a parasitic inductance of the resonant circuit.

11. The aerosol-generating system according to claim 1, wherein the control circuitry is further configured to form an oscillator with the resonant circuit, the oscillator being configured to generate an oscillating signal with a frequency at the predetermined resonant frequency of the resonant circuit.

12. The aerosol-generating system according to claim 11, wherein the control circuitry is further configured to measure the frequency of the oscillating signal from the oscillator.

13. A cartridge for an aerosol-generating system, the cartridge comprising:

an aerosol-forming substrate;

an electric heater;

a connection end configured to connect the cartridge to an aerosol-generating device, the connection end of the cartridge comprising electrical contacts configured to electrically connect the cartridge to the aerosol-generating device; and a resonant circuit, wherein the resonant circuit is configured to resonate at a predetermined resonant frequency, and wherein the predetermined resonant frequency is associated with an identity of the cartridge.

14. The cartridge according to claim 13, wherein the resonant circuit comprises a capacitor and an inductor.

15. The cartridge according to claim 14, wherein the electric heater comprises a coil and forms the inductor of the resonant circuit.

16. An aerosol-generating device for a cartridge including a resonant circuit, the aerosol-generating device including:

a housing configured to removably receive the cartridge;

a power source configured to supply power to the cartridge;

a connection end configured to connect the aerosol-generating device to a cartridge, the connection end of the aerosol-generating device comprising electrical contacts configured to electrically connect the aerosol-generating device to the cartridge; and control circuitry comprising a controller configured to:

determine a resonant frequency of the resonant circuit when the cartridge is received by the aerosol-generating device, and identify the cartridge based on the determined resonant frequency.

17. The aerosol-generating device according to claim 16, wherein the control circuitry is further configured to form an oscillator with the resonant circuit of the cartridge, the oscillator being configured to generate an oscillating signal with a frequency at the predetermined resonant frequency of the resonant circuit.

* * * * *